United States Patent [19]

Peters

[11] Patent Number: 4,566,119

[45] Date of Patent: Jan. 21, 1986

[54] EQUALIZER NETWORKS AND METHODS OF DEVELOPING SCALING COEFFICIENTS THEREFOR

[75] Inventor: Richard W. Peters, Algonquin, Ill.

[73] Assignee: Industrial Products, Inc., Elk Grove Village, Ill.

[21] Appl. No.: 541,089

[22] Filed: Oct. 12, 1983

[51] Int. Cl.$^4$ ............................................. H03G 5/00
[52] U.S. Cl. .................................. 381/103; 333/28 T
[58] Field of Search .............. 333/28 T; 364/724, 825; 381/99, 101, 103

[56] References Cited

U.S. PATENT DOCUMENTS 2,024,900 12/1935 Wiener et al.
2,128,257 8/1938 Lee et al.
3,624,298 11/1971 Davis et al.
3,715,666 2/1973 Mueller et al.

OTHER PUBLICATIONS

Tattersall, Linear Phase Analog Active Filters with Equiripple Passband Responses, IEEE Transactions on Circuits and Systems, vol. CAS-28, No. 9, pp. 925-927.

Primary Examiner—Forester W. Isen
Attorney, Agent, or Firm—Kinzer, Plyer, Dorn & McEachran

[57] ABSTRACT

An adjustable equalizer network comprises a series chain of N all pass amplifier stages driving M minimum phase shift transversal filters connected to a final summing circuit that includes means to adjust each filter output to obtain a ripple free predetermined frequency response over a given frequency range. Each filter includes N+1 scaling circuits connected to an intermediate summing circuit; the scaling circuits have scaling coefficients, of magnitude and sign determined by Fourier analysis and an appropriate truncation function, such that the filter has a pass band representative of one of M contiguous bands conjointly encompassing the frequency range. The adjustable equalizer, once adjusted for a desired frequency response, may be supplied with a DC reference input and used to determine the contribution (magnitude and sign) to the frequency response from each tap on the all pass chain, thus developing a set of N+1 scaling coefficients for a simplified equalizer network, comprising the all pass chain with just one set of N+1 scaling circuits, that duplicates the response characteristic of the more complex adjustable equalizer. Some embodiments incorporate digital programming and control of the frequency response characteristic.

70 Claims, 9 Drawing Figures

EQUALIZER NETWORKS AND METHODS OF DEVELOPING SCALING COEFFICIENTS THEREFOR

BACKGROUND OF THE INVENTION

Electrical, electronic, and electromechanical systems are often required to transmit a wide range of signal frequencies. However, an imperfect system frequency response can result from inherent characteristics of any component in the overall system. For example, the failure of microphones, loudspeakers and listening spaces (auditoria, studios, etc.) to provide truly flat frequency responses over the full audio frequency range is common and well known. This creates a need for electrical or electronic circuits to complement and correct these frequency response deviations. Such correcting circuits are conventionally called "equalizers" or "equalizer networks" because, when inserted in a system, they provide for a more "equal" response of the system over a specified frequency range. Of course, such "equalizers" may also be used to create an imbalance in the frequency response of a system to meet some special requirement or preference.

Traditionally, equalizers have been designed and realized by two techniques. The first requires a person skilled in the art of empirical filter design. The imperfect system frequency response is examined and a complementary filter is assembled by trial and error. This technique is tedious and time consuming; moreover, it is often impractical and inadequate if precise equalization or precision conformance to a given frequency characteristic are required.

The second conventional equalizer network technique uses a multiplicity of simple resonant circuits. Each circuit is tuned to a given frequency such that a set of such circuits covers the entire frequency range to be equalized. These circuits may comprise band pass filters or band rejection filters. By adjusting the contribution of each filter to the total output, a controlled frequency response is accomplished. Davis et al U.S. Pat. No. 3,624,298 shows a system of this kind, using a set of band rejection filters spaced on one-third octave frequency centers, intended for equalizing a sound reinforcement system. A principal shortcoming of this technique is the superposition of the responses of the individual band filters upon the desired equalized response. Thus, the overall response shows bumps and dips at transition points where the response crosses over from one filter to another. Also, the transient response shows ringing from the individual filters in the equalizer output. To minimize the magnitude of these bumps and dips and transient ringing, the individual filters can be less sharply tuned or can be spaced closer together, or both. This, however, results in a system in which a given band of the overall frequency range is responsive to several adjacent filters and requires many reiterative adjustments among the adjacent band controls.

Wiener and Lee U.S. Pat. No. 2,024,900 and Lee and Wiener U.S. Pat. No. 2,128,257 describe a technique for synthesizing frequency responsive networks by means of orthonormal functions. In particular, these patents disclose a technique for representing any desired frequency response in a Fourier series which is composed of the sins/cosine orthonormal functions. Moreover, they describe an all pass passive ladder network which provides a frequency response described by such a Fourier series. Finally, they show that the coefficients in the Fourier series representing the desired frequency response can be directly related to scaling resistors in the all pass ladder network. In this manner, Wiener and Lee devised a system of adjustable equalizers using passive ladder networks and mechanically ganged potentiometers. That system, although theoretically workable, is extremely unwieldly to implement.

The Wiener and Lee equalizer networks constitute filters that are each symmetrical relative to a given center point; each filter network includes an even number of sections with the two center sections being of corresponding construction, the next two sections having the same parameters, and so on. A substantial problem, in a symmetrical equalizer system like that proposed by Wiener and Lee, is the need for impedance matching between adjacent sections, which may be quite difficult. That basic problem can be alleviated by replacing the passive ladder network filters of Wiener and Lee with active operational amplifier circuits, specifically first order all pass amplifiers, as in the filters proposed by G. D. Tattersall in the brief article "Linear Phase Analog Active Filters with Equiripple Passband Responses" in *IEEE Transactions on Circuits and Systems*, Vol. CAS-28, No. 9, September, 1981, pp. 925–927. The Tattersall filters, like those of Wiener and Lee, are of symmetrical construction, and are configured to afford approximately the same degree of ripple in the rejection band as in the pass band of the filter.

The Tattersall technique affords a linear phase transversal filter in which all frequencies are delayed by the same amount regardless of whether they are filtered (attenuated) or not. This requires that each all pass amplifier stage operate only on a limited portion of its frequency response characteristic that is essentially linear, requiring more individual stages than is economically desirable. These filters are not adapted to operation as minimum phase shift transversal filters, a characteristic that is highly desirable in an equalizer.

The use of a limited, finite number of stages in an all pass ladder network as proposed by Wiener and Lee results in truncation errors known in Fourier anaylsis as the "Gibbs phenomenon". The same basic problem occurs in connection with the Tattersall filters. The Wiener and Lee networks, and the Tattersall filters, are confined to real frequency responses; they do not extend to a minimum phase frequency response.

Calculation of the scaling coefficients for an equalizier network utilizing all pass operational amplifier circuits functioning as the equivalent of a substantial number of minimum phase shift transversal filters and having a specified frequency response characteristic covering a broad frequency range is extremely difficult and, indeed, virtually impossible. Another major difficulty in formulating an equalizer network of this type is encountered if it becomes necessary to modify the frequency response characteristic. Interactions between the individual stages of the equalizer network make determination of the necessary changes by mathematical analysis a practical impossibility. To some extent, these problems can be alleviated by an equalizer network that incorporates a multiplicity of individual filters; an equalizer of that kind can be economically acceptable and operationally desirable in some applications, particularly those involving continuing changes in frequency response requirements. This approach, however, results in an equalizer that is excessively complex, unduly costly, and substantially larger than desirable for many applications. At present, it appears that there is no known straightforward design technique adapted to development of an equalizer network having a minimum phase shift frequency response characteristic with a limited, practical number of stages that is capable of covering a broad frequency range, such as the full audio range, with minimum ripple and with little or no ringing from individual stages of the equalizer network.

SUMMARY OF THE INVENTION

It is an object of the present invention, therefore, to provide a new and improved equalizer network of simple and economical construction, having a minimum phase shift frequency response characteristic that requires only a limited number of individual all pass amplifier stages, yet is capable of covering a broad frequency range such as the audio frequency range with minimum ripple over that range and that is capable of affording any desired frequency response characteristic.

Another object of the invention is to provide a new and improved equalizer network of the minimum phase shift type that is highly stable in operation, that exhibits little or no ringing from individual stages of the network, and that provides for smooth truncation to minimize or eliminate "Gibbs phenomenon" errors.

A further object of the invention is to provide a new and improved equalizer network of the minimum phase shift type that can be readily adjusted to change the frequency response characteristic of the network to fit virtually any overall system requirement while preserving the aforementioned characteristics of minimum ripple, no ringing, stable operation, and smooth truncation.

Another object of the invention is to provide a new and improved minimum phase shift equalizer network, utilizing a single chain of all pass operational amplifier stages, that can be quickly and accurately modified to accommodate changing system requirements; in some embodiments such modifications are accomplished by manual adjustments and in other embodiments the modifications are effected by control signals applied to the equalizer networks.

Another object of the invention is to provide a new and improved method of determining the circuit parameters for a minimum phase shift equalizer network based on a chain of all pass operational amplifier stages, a method that allows for the use of a single, simple scaling resistance for each stage in the network chain to complete an equalizer network that provides a frequency response characteristic corresponding in all essential details to a response characteristic that would otherwise require a large group of filter circuits for each of a substantial number of frequency bands throughout the operating range of the equalizer.

A particular object of the invention is to provide a new and improved method of varying the scaling circuit parameters, in an adjustable minimum phase shift equalizer network having a plurality of groups of scaling circuits all connected to a single chain of all pass stages, coupled with a method for utilizing the resulting adjustable equalizer network to determine circuit parameters for a simplified equalizer network, using a much smaller number of scaling circuits, that is capable of reproducing the same frequency response characteristics as the adjustable network.

Another object of the invention is to provide a new and improved method for direct generation of scaling coefficients to establish virtually any desired frequency response in a Fourier transform minimum phase shift equalizer network operable over a broad frequency range.

Accordingly, in one apparatus embodiment the invention relates to an equalizer network adapted to develop an equalized output signal having a predetermined frequency response characteristic, with minimum phase shift and minimum ripple, over a preselected frequency range; the network comprises a series chain of N all pass delay stages, the chain having a initial tap connected to the input to the first stage in the chain and N additional taps each connected to the output of a succeeding stage in the chain, M minimum phase shift transversal filters, all connected to and including the series chain of all pass delay stages, each filter developing an intermediate signal within a pass band representative of one of a contiguous series of M nominal frequency bands extending accross the frequency range, final summing circuit means for additively combining the intermediate signals in predetermined amplitude relation to each other to develop the equalized output signal, and adjusting means for adjusting the amplitude of each intermediate signal, independently of the others, to adjust the overall frequency response characteristic of the equalizer network.

In another apparatus embodiment, the invention relates to an equalizer network adapted to develop an equalized output signal having a predetermined frequency response characteristic with minimum phase shift and minimum ripple, over a preselected frequency range; the network comprises a series chain of N all pass delay stages, the chain having an initial tap connected to the input to the first stage in the chain and N additional taps each connected to the output of a succeeding stage in the chain, N+1 scaling circuits, each connected to one of the taps, each scaling circuit having a scaling coefficient with a magnitude and polarity representative of the algebraic sum of the scaling coefficients, for the tap to which the scaling circuit is connected, in a group of M smoothly truncated minimum phase shift transversal filters covering contiguous frequency bands encompassing the preselected frequency range and driven by a corresponding chain of N all pass delay stages, which M filters conjointly afford the predetermined frequency response characteristic over the preselected frequency range, and summing circuit means for additively combining the outputs of all of the scaling circuits, in the polarity relationships determined by their respective scaling coefficients, to develop the equalized output signal.

A subcombination embodiment of the invention relates to a scaling control signal generator for generating a series of scaling control signals for a simplified equalizer network comprising a series chain of N all pass delay stages having an initial output tap connected to the input to the first stage in the chain and N additional output taps each connected to the output of a succeeding stage in the chain, N+1 scaling circuits each connected to one of the output taps, each scaling circuit including a multiplying digital to analog convertor for multiplying an input signal from the associated chain output tap by a digital scaling control signal indicative of a scaling coefficient, and summing circuit means for additively combining the outputs of all of the scaling circuits in the polarity relationships determined by their respective scaling coefficients. The scaling control signal generator comprises reference signal generator means for generating a series of M DC reference signals $H_1$ through $H_M$ conjointly representative of the frequency response characteristic of the equalizer network in accordance with the relationship $$H(\theta) = \sum_{n=0}^{N} a_n e^{-in\theta};$$

multiplier means for multiplying the reference signals by a sequence of digital function data signals representative of the Fourier function series $$\frac{2}{\pi} \left[ \frac{\sin n\theta_{m+1} - \sin n\theta_m}{n} \right],$$

in which n is the number of one stage in the all pass chain, to develop a series of sequences of intermediate digital scaling coefficient signals, and accumulator means for adding each sequence of intermediate digital scaling coefficient signals to generate a series of digital scaling control signals each representative of the scaling coefficient for one scaling circuit in the equalizer network.

In a method embodiment, the invention relates to a method of developing the scaling coefficients to obtain a predetermined frequency response characteristic, over a preselected frequency range, from a simplified equalizer network comprising a series chain of N all pass delay stages having an initial output tap connected to the input to the first stage in the chain and N additional output taps each connected to the output of a succeeding stage in the chain, N+1 scaling circuits each connected to one of the output taps, and summing circuit means for additively combining the outputs of all of the scaling circuits in the polarity relationships determined by their respective scaling coefficients. The method comprises the following steps:

A. providing an adjustable equalizer network comprising a series chain of N all pass delay stages having the same construction as the all pass chain of the simplified network, M minimum phse shaft transversal filter circuits each comprising N+1 scaling circuits connected to the all pass chain and an intermediate summing circuit for additively combining the filter scaling circuit outputs in predetermined polarity relationships to develop an intermediate signal in one of a series of M pass bands extending across the frequency range, and final circuit summing means for additively combining the intermediate signals to develop an equalized output signal;

B. applying a "white" noise signal to the all pass chain of the adjustable equalizer network;

C. adjusting the relative amplitudes of the intermediate signals to obtain the predetermined frequency response characteristic at the output of the adjustable equalizer network;

D. substituting a DC reference signal input for the white noise input to the adjustable equalizer network;

E. disconnecting the filter circuits of the adjustable equalizer network from all but one tap of the all pass chain for that network;

F. measuring the amplitude and polarity of the DC output from the adjustable equalizer to determine the magnitude and sign of a scaling coefficient for the scaling circuit of the simplified equalizer network for that one tap of the all pass chain; and G. repeating steps E and F for each of the remaining N taps of the all pass chain.

DESCRIPTION OF THE PREFERRED EMBODIMENTS

Figure 1:
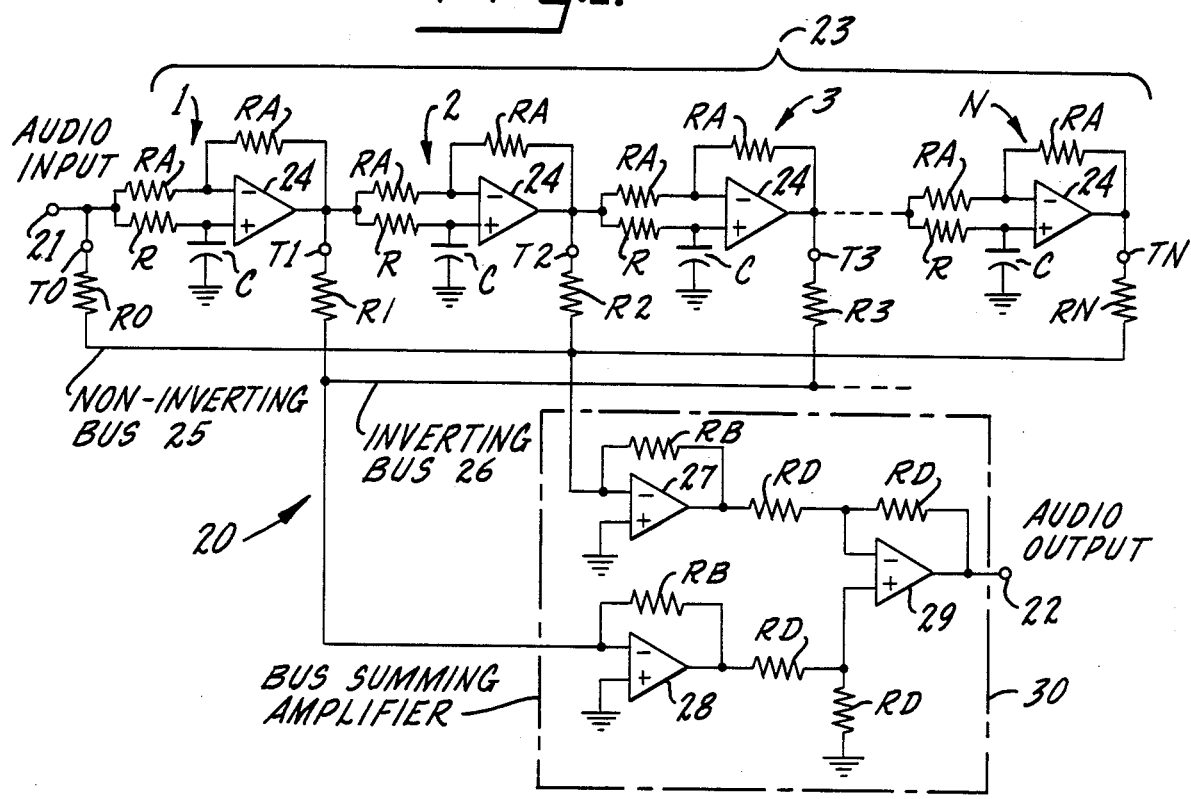
FIG. 1 is a simplified schematic circuit diagram of a network which, when provided with appropriate scaling circuit parameters, affords a minimum phase shift equalizer constructed in accordance with one embodiment of the present invention.

FIG. 1 illustrates a network 20 that may constitute a band pass filter adapted for use in an equalizer network when joined with other circuits as described in connection with some of the other drawings, particularly FIG. 3, but that can also incorporate circuit parameters effective to complete a minimum phase shift equalizer network affording virtually any desired frequency response characteristic with minimum ripple over a broad frequency range, typically the audio range.

Network 20 has an audio input terminal 21 and an audio output terminal 22. Input terminal 21 is connected to a series chain 23 of N all pass delay stages; all stages in chain 23 incorporate the same circuit parameters. The first stage 1 in chain 23 includes an operational amplifier 24 having its non-inverting input connected to the audio input terminal 21 by a circuit including a series resistance R and a shunt capacitance C. The inverting input of operational amplifier 24 is connected to the audio input terminal 21 by a series resistance RA; the output of the operational amplifier is connected back to its inverting input through a corresponding resistance RA. The output of amplifier 24 in stage 1 constitutes the input for stage 2. The output of the amplifier 24 in stage 2 provides the input to stage 3, and so on down the chain to stage N. The number of stages N in the series chain 23 may vary substantially, depending upon overall system requirements.

An initial output tap T0 is connected to input terminal 21, the input for the first stage in the all pass delay chain 23. Network 20 further includes N additional output taps T1, T2, T3, ... TN each connected to the output of the operational amplifier of a succeeding stage in the chain. Thus, tap T1 is connected to the output of the amplifier 24 in stage 1, tap T2 is at the output of the amplifier in stage 2, and so on.

An initial scaling circuit is connected to the initial output of series chain 23 of all pass delay stages. In network 20, the initial scaling circuit comprises a resistor R0 that connects tap T0 to a non-inverting inverting bus 25. Network 20 further includes N additional scaling circuits, each comprising a resistor (R1 ... RN) connecting one of the taps T1 through TN to the non-inverting bus 25 or to an inverting bus 26. The basis for selection of the bus connections for the scaling circuit resistors R1 through RN is described hereinafter.

Network 20, FIG. 1, further includes a summing circuit 30 for additively combining the outputs of all of the scaling circuits comprising resistors R0 through RN to develop an output signal having a predetermined frequency response characteristic. Summing circuit 30 includes an operational amplifier 27 having its inverting input connected to the non-inverting bus 25. The non-inverting input to amplifier 27 is connected to system ground; a negative feedback resistor RB connects the output of amplifier 27 back to its inverting input. Another operational amplifier 28 is connected in a similar circuit arrangement except that its inverting input is derived from inverting bus 26. The outputs of amplifiers 27 and 28 are individually connected, through two series resistors RD, to the inverting and non-inverting inputs, respectively, of another operational amplifier 29 utilized as a summing amplifier. The non-inverting input to amplifier 29 is returned to system ground through another resistor RD. The output of amplifier 29, which is connected to the audio output terminal 22 of network 20, is connected through a feedback resistor RD to the inverting input of the amplifier.

The network 20 illustrated in FIG. 1 may be made to produce different frequency response characteristics by varying the magnitude of the scaling resistances R0 through RN and by changing the connections of the individual scaling resistors to buses 25 and 26. Each all pass stage in chain 23 has the property of passing all frequencies, over a wide range, with unity gain; hence the derivation of the term "all pass". However, each delay stage in chain 23 produces a phase shift $\theta$ in any signal of any frequency f, within the operational range, where $$\theta = 2 \tan^{-1} f 2\pi RC \quad (1)$$

Thus, the response of each stage 1 through N in chain 23 is simply a phase shift factor $e^{-i\theta}$. The accumulated phase shift, from the first output tap T0 to the final output tap TN in chain 23, is $N\theta$ and the phase shift factor is $e^{-iN\theta}$. The output of each of the all pass delay stages 1 through N contributes to the final output of network 20 through the scaling or weighting circuits for each stage, provided by the resistances R0 through RN. In the bus summing amplifier circuit 30, amplifiers 27 and 28 convert the total current from buses 25 and 26, respectively to voltages. Those voltages are then additively combined (subtracted) in the output stage 29 of the summing circuit 30.

The overall frequency response $H(\theta)$ of network 20, FIG. 1, is $$H(\theta) = \sum_{n=0}^{N} a_n e^{-in\theta} \quad (2)$$

in which $a_n$ represents the scaling coefficient for any stage n in chain 23, determined by $$a_n = \pm RB/Rn, \quad (2)$$

where $Rn$ is the scaling resistance for stage n. The polarity of the scaling coefficient $a_n$ for any tap in chain 23 determines whether the scaling circuit resistance (R0 through RN) for that tap is connected to the non-inverting bus 25 or to the inverting bus 26.

Figure 2:
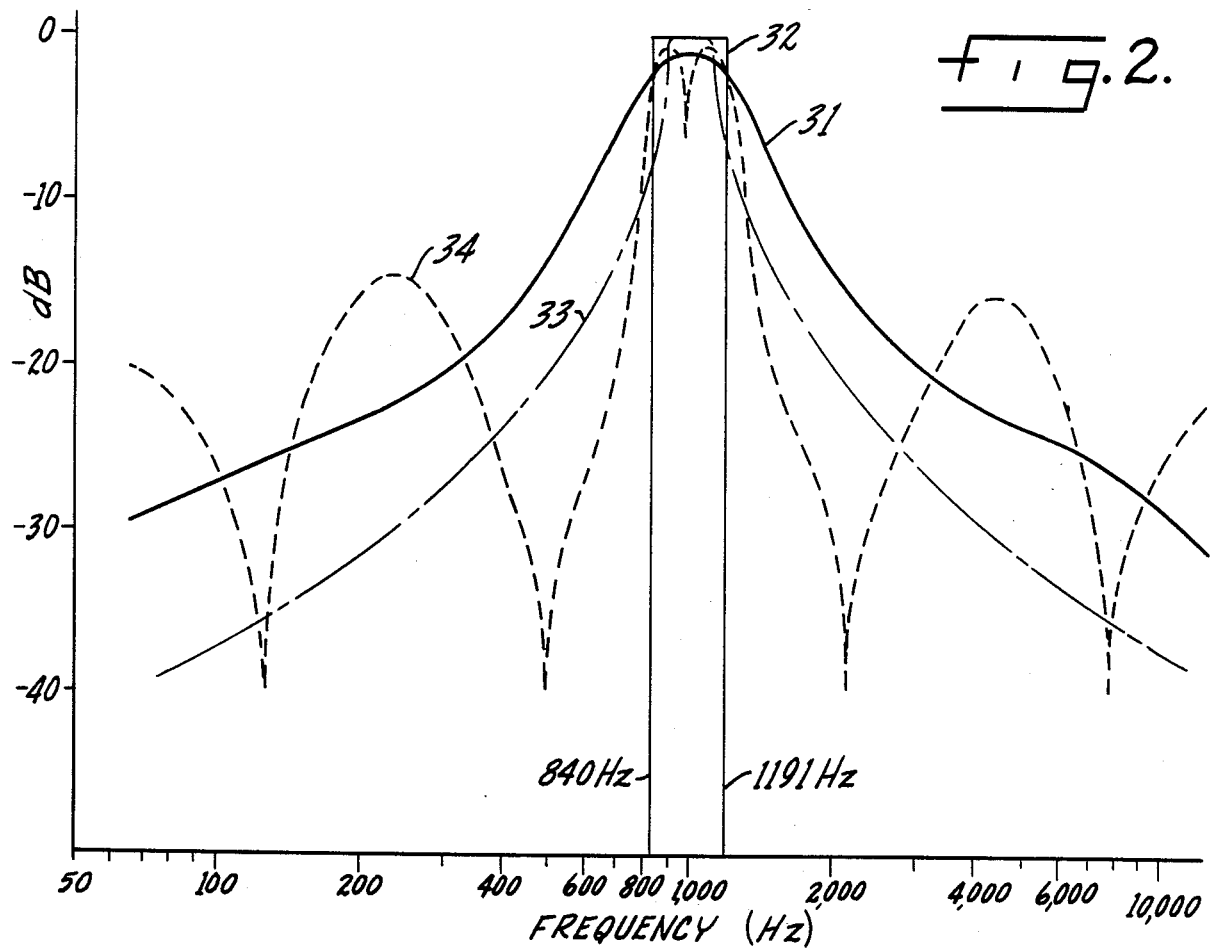
FIG. 2 comprises a series of frequency response charts utilized in explaining operational characteristics for the circuit of FIG. 1 when functioning as a band pass filter.

Curve 31 in FIG. 2 illustrates a band pass filter response, based on an idealized characteristic 32, that may be obtained with network 20, FIG. 1, when the circuit parameters for the individual stages of chain 23 are R=100 kilohms, C=0.015 microfarads, and N=16, using scaling coefficients calculated in accordance with the following relationships:

$$a_o = \frac{1}{\pi} [\theta_{m+1} - \theta_m], \text{ and} \quad (3)$$

$$a_n = \frac{2}{\pi} \left[ \frac{\sin n\theta_{m+1} - \sin n\theta_m}{n} \right] W(n) \text{ for } n > 0,$$

in which $\theta_{m+1}$ and $\theta_m$ are the phase shifts for the upper and lower frequency limits of a series of M idealized filter pass bands, like curve 32, covering a given frequency range. For characteristics 31 and 32, FIG. 2, the center frequency is 1000 Hz. The formulas (3) assume an ideal band pass 32 expanded in a Fourier series. If the series were continued to N=∞, then the idealized response of phantom line curve 33 would be obained. However, by truncating the Fourier series at a finite value (e.g., N=16), the result is a frequency response curve as indicated by dash line 34. Curve 34 illustrates the "Gibbs phenomenon".

The overshoot and undershoot of curve 34 can be reduced by gradually reducing the scaling coefficients for the individual stages of network 20 toward zero as n increases. This is the significance of the expression W(n) in equation (3). A preferred formula for the weighting function W(n) is $$W(n) = 0.54 + 0.46 \cos \frac{\pi n}{N}. \quad (4)$$

This is the Hamming weighting function, and results in conversion of the distorted characteristic 34 to the frequency response characteristic 31 (FIG. 2). To complete this description of utilization of network 20, FIG. 1, as a band pass filter, it may be noted that the phase shifts $\theta_{m+1}$ and $\theta_m$ based upon the upper and lower frequencies of the pass band represented by the ideal curve 32 in FIG. 2, are $\theta_m = 1.397$ radians (at 840 Hz),
$\theta_{m+1} = 1.745$ radians (at 1191 Hz).

The network 20 illustrated in FIG. 1, as thus far described, is not an equalizer; it comprises a band pass filter. FIG. 3 illustrates a network 120 that incorporates a group of M sets of scaling circuits and M summing amplifiers, all utilizing one all pass amplifier chain 23, in a complete equalizer network operable across the entire audio frequency range.

Figure 3:
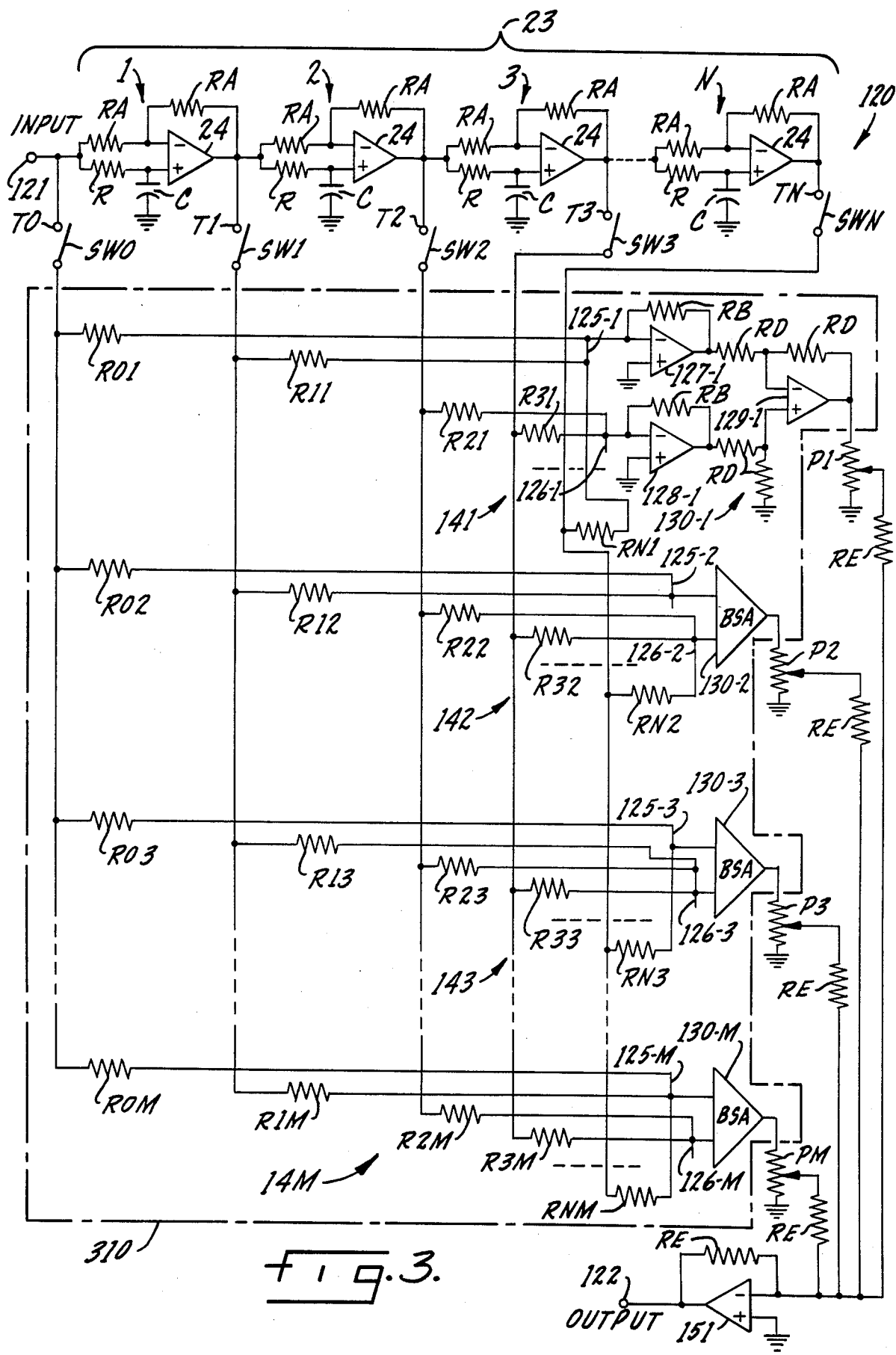
FIG. 3 is a simplified schematic diagram illustrating another embodiment of the present invention.

Network 120, FIG. 3, has an input terminal 121 and an output terminal 122. Input terminal 121 is connected to the first stage of a chain 23 of all pass amplifier circuits that corresponds in all respects to chain 23 as described in connection with FIG. 1. Thus, each stage 1 through N in chain 23 again includes an operational amplifier 24 with a non-inverting input circuit comprising a series resistor R and a capacitor C; the inverting input circuit of each amplifier includes a series resistance RA, and each amplifier is provided with a negative feedback circuit that also constitutes a resistance RA. The outputs of the amplifiers 24 in stages 1 through N are each connected to one of the taps T1 through TN. Input terminal 121 is connected to tap T0. In addition, in network 120 chain 23 is provided with a series of individual switches SW0 through SWN, each connected to one of the taps T0 through TN.

Network 120 includes a group 310 of M filters, each constructed like the filter described in connection with FIG. 1 but with all of the filters 141 through 14M driven from the one chain of all pass circuits 23. Thus, the first filter 141 in group 310 includes an initial scaling circuit comprising a scaling resistance R01 that is connected to the initial tap T0 of chain 123 through switch SW0 and to a non-inverting bus 125-1. A second scaling circuit in filter 141 comprises a resistor R11 connected to tap T1 of chain 23 through switch SW1 and also connected to the non-inverting bus 125-1. The next scaling circuit in filter 141 includes a resistor R21 connected to tap T2 through switch SW2 and also connected to an inverting bus 126-1. A similar connection is provided for the next scaling circuit in filter 141, comprising a resistor R41. The final scaling circuit in filter 141 includes a resistor RN1 connected to tap TN of chain 23 through switch SWN and shown as connected to the non-inverting bus 125-1.

The output for filter 141, FIG. 3 is developed by a bus summing amplifier 130-1 that corresponds fully in construction to amplifier 30 of FIG. 1. Thus, amplifier 130-1 incorporates two amplifiers 127-1 and 128-1 used to convert the currents from buses 125-1 and 126-1, respectively, into voltages that are then additively combined (subtracted) in an output amplifier 129-1.

The remaining filters 142 . . . 14M in network 120 each correspond in construction to filter 141. Thus, filter 142 incorporates a series of scaling circuits comprising resistors R02 through RN2, each connected to one of two buses 125-2 and 126-2 with the outputs from the two buses being additively combined in a summing circuit shown as the bus summing amplifier 130-2. Filter 143 incorporates a series of scaling resistors R03 through RN3 connected to two buses 125-3 and 126-3 that feed a summing amplifier circuit 130-3. The last filter in the group, filter 14M, incorporates a sequence of N+1 scaling circuits comprising the resistors R0M through RNM, each connected to one of the two buses 125-M and 126-M that afford the inputs to a summing circuit 130-M.

The output of filter 141 in the network 120 of FIG. 3 is connected to one terminal of a potentiometer P1 that is returned to system ground, the tap on potentiometer P1 being connected through a resistor RE to the inverting input of an operational amplifier 151; the output of amplifier 151 is connected to output terminal 122. Each of the remaining filters 142 through 14M in network 120 is similarly connected through one of a series of potentiometers P2 through PM and through a resistor RE to the inverting input of amplifier 151. The non-inverting input of amplifier 151 is returned to system ground. The output of amplifier 151 is connected back to the inverting input through a negative feedback resistor RE. Amplifier 151 constitutes a final summing amplifier circuit for network 120, adding up all of the M filter outputs to produce an equalized output signal at terminal 122.

Figure 4:
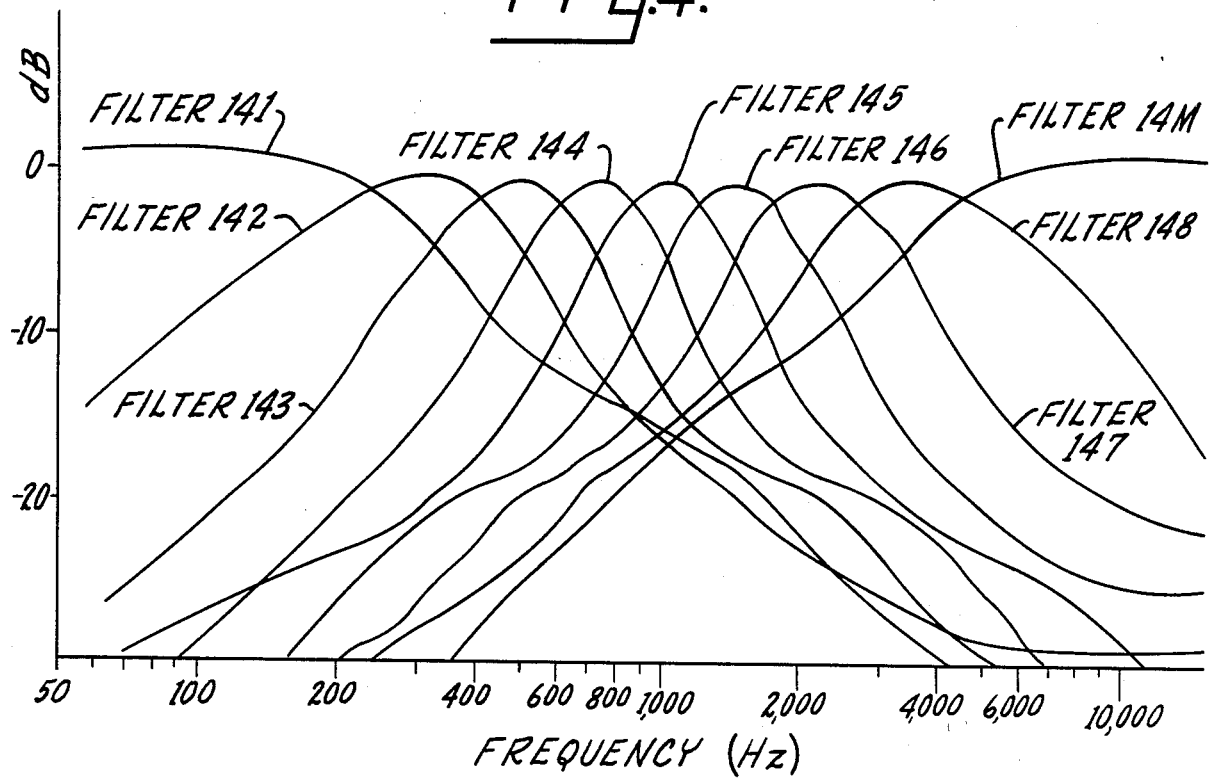
FIGS. 4 and 5 are additional frequency response curves employed in explanation and illustration of the operation of the equalizer network of FIG. 2.

In network 120, filter 141 is a low pass filter, filter 14M is a high pass filter, and each of filters 142 to 14M-1 is a band pass filter. The output level of each filter is controlled by its associated potentiometer P1 through PM. This group of filters can incorporate circuit parameters, specifically the scaling circuit resistors in the filters, effective to afford a sequence of response characteristics as illustrated in FIG. 4, for which M=9. Adjustments of potentiometers P1 through PM in the outputs of filters 141 through 14M make it possible to vary the amplitudes of the frequency response characteristics of the individual filters, FIG. 4, to afford a wide variety of overall frequency response characteristics for network 120. Thus, it is seen that network 120 effectively provides an equalizer that can be adjusted to give virtually any desired frequency response thoughout a broad range of frequencies, in this instance the full audio range.

Determination of the scaling coefficients for each of filters 141-14M in network 120 is preferably accomplished using the relationships set forth above in equations (3) and (4). For an equalizer network covering the audio range, as illustrated in FIG. 4, incorporating sixteen stages in all pass chain 23 and nine filters, the resistance values and connection polarities, determined in this manner, are as set forth in Table I.

TABLE I

| | FILTER AND CENTER FREQUENCY OF FILTER | | | | | | | | |
|---|---|---|---|---|---|---|---|---|---|
| Resistor | 141 87.5 Hz | 142 268 Hz | 143 466 Hz | 144 700 Hz | 145 1KHz | 146 1.43K | 147 2.15K | 148 3.73K | 14 M 11.43K |
| R0 | +200K | +200K | +200K | +200K | +200K | +200K | +200K | +200K | +200K |
| R1 | +102K | +118K | +158K | +294K | ∞ | −294K | −158K | −118 | −102K |
| R2 | +113K | +210K | −620K | −137K | −105K | −137K | −620K | +210K | +113K |
| R3 | +130K | ∞ | −130K | −130K | ∞ | +130K | +130K | ∞ | −130K |
| R4 | +158K | −248K | −130K | +680K | +121K | +680K | −130K | −243K | +158K |
| R5 | +210K | −158K | −402K | +140K | ∞ | −140K | +402K | +158K | −210K |
| R6 | +316K | −158K | +316K | +316K | −158K | +316K | −158K | +316K | +316K |
| R7 | +560K | −215K | +191K | −287K | ∞ | +287K | −191K | +215K | −560K |
| R8 | +1.3 M | −452 K | +301K | −243K | +226K | −243K | +301K | −452K | +1.3 M |
| R9 | ∞ | ∞ | ∞ | ∞ | ∞ | ∞ | ∞ | ∞ | ∞ |
| R10 | −2.2 M | +750K | −510K | +412K | −383K | +412K | −510K | +750K | −2.2 M |
| R11 | −1.6 M | +620K | −560K | +820K | ∞ | −820K | −560K | −620K | +1.6 M |
| R12 | −1.6 M | +750K | −1.6 M | −1.6 M | +750K | −1.6 M | −1.6 M | +750K | −1.6 M |
| R13 | −1.8 M | +1.5 M | +3.6 M | −1.2 M | ∞ | +1.2 M | −3.6 M | −1.5 M | +1.8 M |
| R14 | −2.7 M | +3.9 M | +2.2 M | −12 M | −2 M | −12 M | +2.2 M | +3.9 M | −2.7 M |
| R15 | −4.5 M | ∞ | +4.3 M | +4.3 M | ∞ | −4.3 M | −4.3 M | ∞ | +4.2 M |

TABLE I-continued

| | FILTER AND CENTER FREQUENCY OF FILTER | | | | | | | | |
|---|---|---|---|---|---|---|---|---|---|
| | 141 | 142 | 143 | 144 | 145 | 146 | 147 | 148 | 14 M |
| Resistor | 87.5 Hz | 268 Hz | 466 Hz | 700 Hz | 1KHz | 1.43K | 2.15K | 3.73K | 11.43K |
| R16 | −8.2 M | −15 M | ∞ | +10 M | +7.5 M | +10 M | ∞ | −15 M | −8.2 M |

In Table I, the use of the infinity sign is to indicate an open circuit, which in some instances may represent a scaling resistance value large enough so that there is no need to provide any circuit connection.

Equalizer network 120 affords a minimum phase shift frequency response characteristic, over a broad frequency range such as the audio frequency range, that exhibits minimum ripple despite the fact that only a limited number of stages (sixteen) are incorporated in the single all pass amplifier chain 23 that drives all of the filters. Network 120 is highly stable in operation and exhibits little or no ringing from individual stages of the network. With the scaling circuits determined as described above, network 120 provides for smooth truncation that is effective to minimize or eliminate "Gibbs phenomenon" errors. On the other hand, network 120 can be readily adjusted to change the frequency response characteristic of the overall network to fit virtually any change in system requirements. For an audio reproduction system or other system that is subject to variable operating conditions, network 120 affords an adjustable equalizer that is highly advantageous as compared with previously known equalizers, both as regards cost and complexity of construction and operational characteristics.

In those applications in which network 120 is to be used directly as an equalizer, switches SW0 through SWN are unnecessary and may be omitted. These switches, however, make it possible to utilize network 120 as a design tool for the formulation of an equalizer network, corresponding in construction to network 20 of FIG. 1, that retains all of the operational advantages of network 120, apart from adjustability, with a substantial saving in both complexity and cost.

Figure 5:
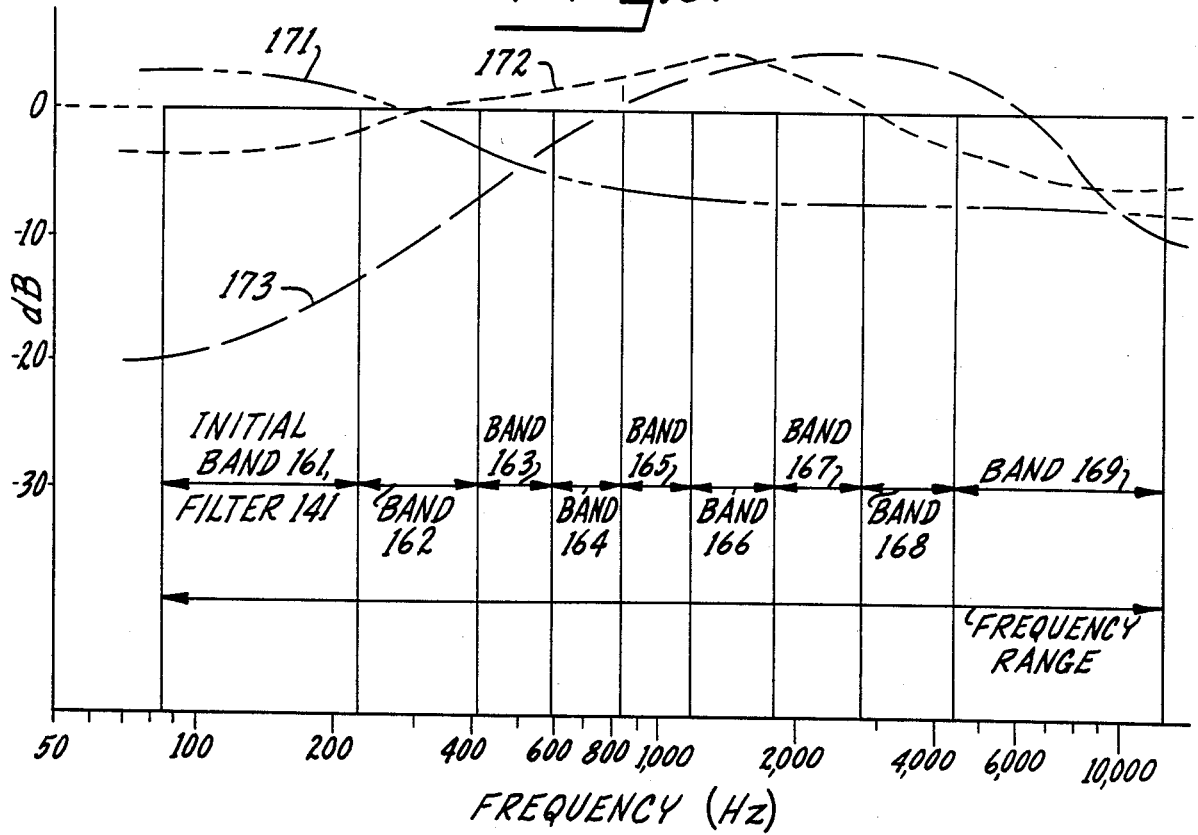

In considering the use of network 120 as a design tool, it may first be assumed that the network has been placed in operation with switches SW0–SWN all closed and a suitable "white" audio input signal supplied to terminal 121, followed by adjustment of potentiometers P1 through PM to achieve a specific frequency response characteristic required for a given system application. That is, filters 141 through 14M (in this instance 14M is 149) have been initially constructed to cover a series of nominal frequency bands 161 through 169 as illustrated in FIG. 5, using the design techniques described above for FIG. 1. Thereafter, potentiometers P1 through PM (FIG. 3) have been adjusted so that the overall frequency response for system 120 corresponds to the specific characteristic required, such as one of the curves 171–173 in FIG. 5. For an equalizer to be utilized in a system having relatively fixed characteristics, with little prospect for a requirement for change in the frequency response characteristic of the equalizer at a subsequent time, the equalizer design tool capabilities of network 120 can now be utilized.

With network 120 adjusted as described, all of the switches SW1 through SWN are opened, leaving only switch SW0 closed, and a reference DC signal is supplied to input terminal 121 of network 120. The amplitude of the resulting DC output signal at terminal 122 is measured and the polarity of that signal is determined. This provides the basis for selection of a scaling resistance R0 for use in a network 20 as shown in FIG. 1, with that network subsequently to be utilized as an equalizer instead of a band pass filter. This same procedure is repeated N additional times, each time with only one of the switches SW1 through SWN closed, to determine the magnitude and connection polarity for each of the remaining scaling circuit resistances R1 through RN of network 20. Using this technique, an equivalent single resistor can be selected to replace all of the resistors R01 through R0M in network 120 as the resistance R0 in network 20, and so on. The equivalent scaling resistors determined in this manner, when incorporated in the scaling circuits of network 20, FIG. 1, afford a simple and economical equalizer network having a frequency response matching that arrived at by manipulating the potentiometers P1 through PM in network 120, FIG. 3.

Using this technique, with equalizer network 120 serving as a tool for designing greatly simplified equalizers having fixed frequency response characteristics, it becomes possible to produce low cost equalizers having response characteristics precisely tailored to virtually any requirements. Those equalizers, despite their simplicity of construction, as is evident from FIG. 1, afford stable, minimum phase shift frequency response characteristics having minimum ripple with no ringing from individual stages and with smooth truncation effectively eliminating Gibbs phenomenon errors.

Figure 6:
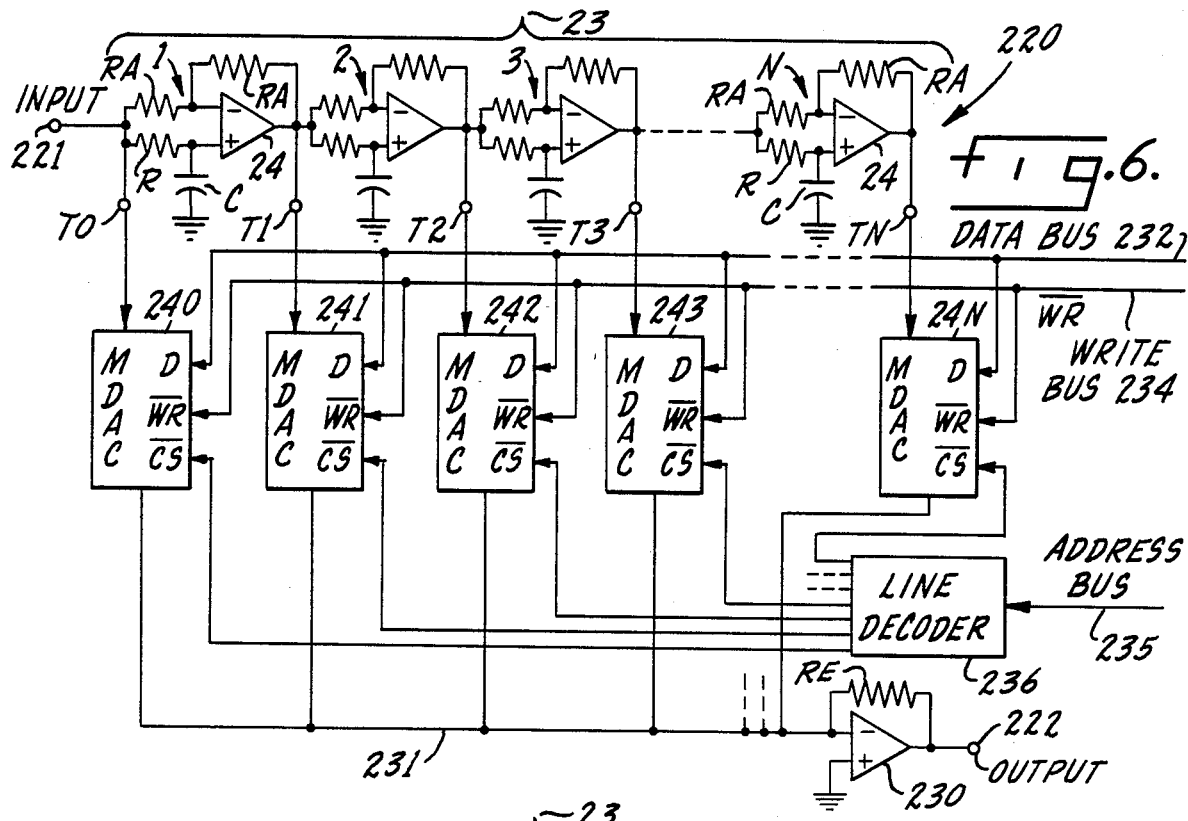
FIG. 6 is a simplified schematic diagram of an equalizer network constituting another embodiment of the present invention.

FIG. 6 illustrates an equalizer network 220 constructed in accordance with another embodiment of the invention. Equalizer 220 is similar in many respects to network 20 (FIG. 1) when employed as an equalizer network; however, the scaling circuits and summing circuit have been substantially modified.

Equalizer network 220 has an input terminal 221 and an output terminal 222. Input terminal 221 is connected to the first stage of a chain 23 of N all pass delay stages, again shown as all pass operational amplifier stages each including an operational amplifier 24. As before, each stage has a series resistance R and shunt capacitance C providing an input to the non-inverting input of the operational amplifier, with a series resistance RA as the inverting input to the amplifier and a negative feedback circuit of resistance RA. Also as before, chain 23 is provided with an initial output tap T0 connected to input terminal 221 and a series of N additional output taps T1 through TN each connected to the output of one of the amplifier stages.

In equalizer network 220, the initial scaling circuit connected to tap T0 is a multiplying digital to analog converter (MDAC) 240. The signal input to MDAC 240 is the voltage from tap T0 of chain 23. A current output from MDAC 240 is supplied to the inverting input of an operational amplifier 230 which serves as a summing circuit for network 220.

The scaling circuits connected to the remaining taps T1 through TN in equalizer network 220 each incorporate a multiplying digital to analog converter. Thus, MDAC 241 receives an input from tap T1 in chain 23 and has a signal output connected to the bus 231 that is used as an input to amplifier 230. The MDACs 242 through 24N are each connected to one of the taps T2 through TN.

Network 220 further includes a data bus 232 connected to a digital data input D of each of the MDACs 240 through 24N. A WRITE bus 234 is connected to a $\overline{WR}$ input for each of the MDAC circuits. An address bus 235 supplies input signals to a line decoder 236; decoder 236 has N+1 outputs, each connected to a $\overline{CS}$ chip select input of one of the MDAC circuits 240 through 24N.

In network 220, each MDAC functions as a settable resistance. The magnitude of that resistance for each MDAC is determined by a digital word supplied to the MDAC from data bus 232. A sequence of digital words, each identifying the magnitude of resistance required and the polarity of output required for a given MDAC, is supplied repetitively to data bus 232. A corresponding sequence of addresses from bus 235, each address corresponding to just one of the MDAC circuits, is decoded in circuit 236, which supplies enabling signals to the chip select ($\overline{CS}$) inputs of the MDAC circuits in a sequence coordinated with the data signals on the bus 232. Bus 234 supplies WRITE command signals ($\overline{WR}$) to enable each MDAC to record the digital data from bus 232. Each MDAC retains its setting data, from the information supplied on bus 232, in an internal register, until such time as a change may be effected by change of the signals on the data bus. A suitable MDAC circuit of this kind is manufactured by Analog Devices, Model AD7523.

In the operation of equalizer network 220, each scaling circuit MDAC receives a signal input constituting the voltage from the tap (T0 . . . TN) of the all pass amplifier chain 23 to which the MDAC is connected. The signal output from each MDAC, on bus 231, is a current containing all of the frequency components of the input signal and having an amplitude determined by the data set into the MDAC through the digital control signals supplied from data bus 232 and coordinated by information from bus 234 and bus 235. For some of the MDACs, the output signal is inverted; the output polarity is also determined by the digital control signal supplied from data bus 232. All of the output signals from the scaling circuits comprising the MDACs 240 through 24N are additively combined in the summing amplifier circuit 230, producing an equalized output signal at terminal 222 that has a frequency response characteristic determined by the digital data control signals from bus 232.

Thus, network 220, when provided with the requisite information from data bus 232, functions in the same manner as the previously described equalizer networks to afford a minimum phase shift equalizer network with minimum ripple, no ringing from individual stages, stable operation, and smooth truncation. Unlike network 20 of FIG. 1, when employed as an equalizer, network 220 (FIG. 6) can be adjusted to conform to varying system requirements. In this respect, network 220 has the full flexibility of network 120 (FIG. 3). Of course, to utilize the frequency response adjustment characteristics of network 220, it is necessary to provide a source of appropriate control signals on data bus 232; effective circuits for this purpose are described in connection with FIGS. 7 and 8.

Figure 7:
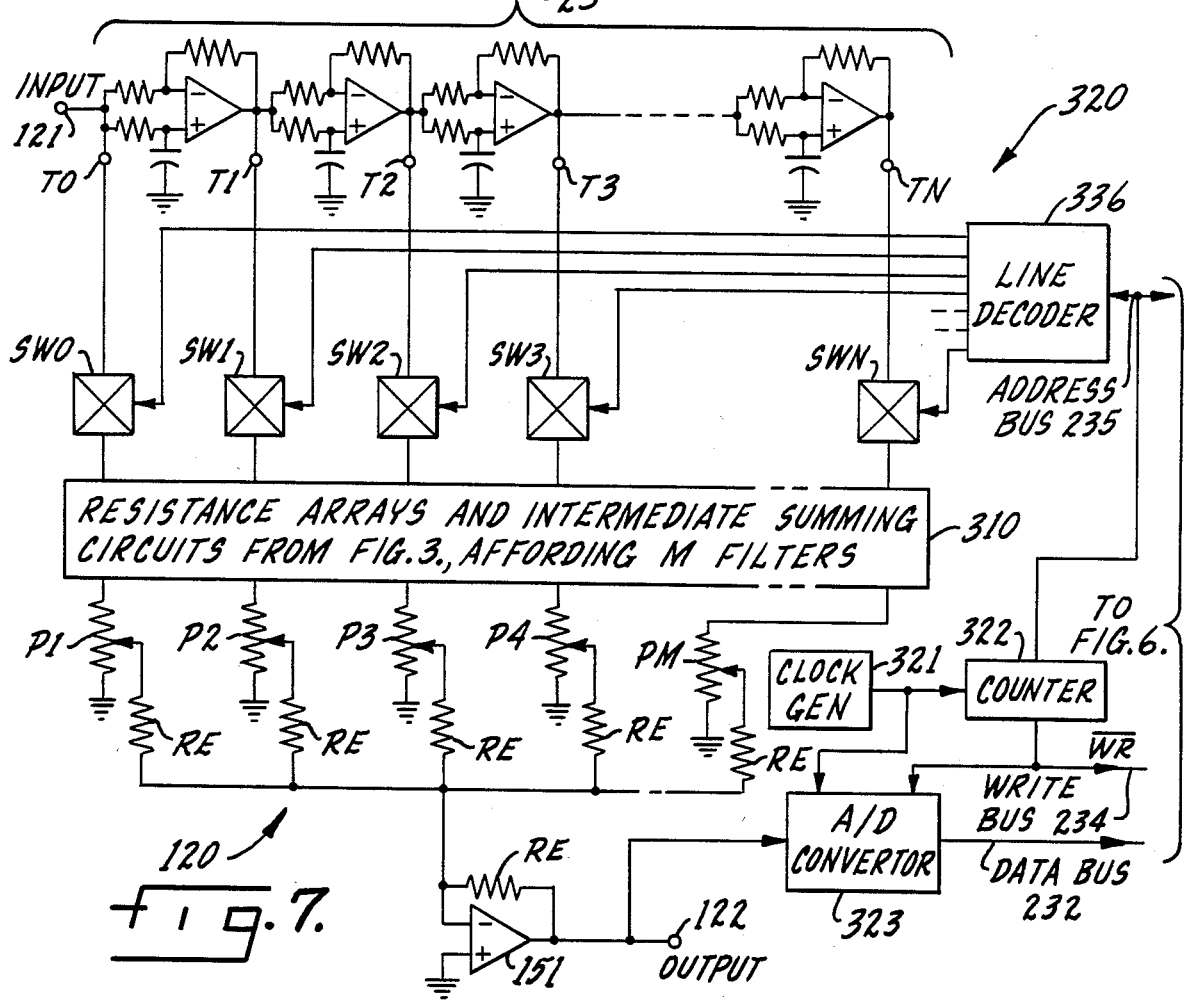
FIG. 7 is a simplified schematic diagram, partly in block diagram form, of an equalizer network utilized to generate control signals for controlling operation of the equalizer of FIG. 6.

FIG. 7 illustrates a circuit 320 that can be utilized to generate the digital scaling control signals required to actuate the equalizer network 220 of FIG. 6 to provide a desired frequency response characteristic in the operation of equalizer 220. Circuit 320 itself incorporates a complete equalizer network 120 having the construction illustrated in FIG. 3; in this instance, however, switches SW0 through SWN are shown as signal actuated electronic switching devices. In all other respects, equalizer network 120, from input terminal 121 to output terminal 122, is the same as shown in FIG. 3, including a repetition of the resistance scaling circuits and summing circuits for filters 141–14M encompassed within outline 310 in each of FIGS. 3 and 7.

Circuit 320, FIG. 7, further comprises a clock signal generator 321, the output of the clock signal generator being supplied to a counter 322 and to an analog/digital converter 323. Counter 322 has an output to converter 323 and that output also constitutes the WRITE bus 234. The output from converter 323 is the data bus 232, buses 232 and 234 being connectable to the equalizer circuit 220 of FIG. 6. Another output from counter 322 (FIG. 7) supplies the address signals for bus 235. A line decoder 336 having the same construction as the line decoder 236 of FIG. 6 is connected to address bus 235 and has a series of individual outputs, one for each of the switches SW0 through SWN in circuit 320, FIG. 7.

In considering the operation of circuit 320, it may first be assumed that the portion of that circuit constituting equalizer network 120 has been set up, by adjustment of potentiometers P1 through PM, to provide a predetermined frequency response characteristic over a preselected frequency range as described above. When that preliminary procedure has been completed, a reference DC voltage is supplied to input terminal 121 of circuit 320 and the clock signal generator 321 is enabled. The output from the clock signal generator causes counter 322 to generate a sequence of address signals, supplied to bus 235 and decoder 336; this sequence of address signals identifies each of the switches SW0 through SWN, in turn, and also serves to identify each of the MDAC circuits 240 through 24N (FIG. 6) in the same sequence. That is, the output signals from line decoder 336 close each of the switches SW0 through SWN in sequence and also serve to supply address signals to the chip select inputs of the MDAC circuits of FIG. 6 in the same sequence. Each time a new address signal is supplied to bus 235, a $\overline{WR}$ signal is applied to bus 234 from counter 322, the $\overline{WR}$ signal being applied to converter 323 in FIG. 7 and to the MDAC circuits in FIG. 6.

Assuming that switch SW0 has been closed by an input signal from line decoder 336, derived from an address signal on bus 235, the corresponding MDAC (FIG. 6) is addressed at the same time to receive a digital scaling control signal. With a DC reference voltage supplied to input terminal 121 (FIG. 7) as previously noted, there is a DC output signal at output terminal 122 proportional to the contribution of tap T0 to the overall operation of equalizer network 120 in circuit 320. This output signal from terminal 122 is supplied to converter 323 and converted to a digital scaling control signal that appears on data bus 232. The $\overline{WR}$ signal on bus 234, which is also applied to converter 323, assures effective recording of the digital scaling control signal, representative of both amplitude and polarity, in MDAC 240.

Subsequently, counter 322 generates the next count, for the next address, corresponding to switch SW1 (FIG. 7) and MDAC 241 (FIG. 6), and supplies that next address signal to bus 235. Switch SW1 is now closed (switch SW0 has opened) and MDAC 241 is set as described above with respect to MDAC 240. In this manner, the frequency response characteristics for network 120 are effectively transferred to and utilized to control the equalizer network 220 of FIG. 6. Thus, the circuit 320 of FIG. 7 can be utilized, by adjustment of potentiometers P1 through PM in the equalizer 120 of that circuit, to establish a desired frequency response characteristic and then generate the control signals required for the MDAC circuits in the equalizer network 220 of FIG. 6 to obtain a duplicate response in equalizer network 220. Of course, it will be recognized that the control program generated for equalizer 220 (FIG. 6) by circuit 320 (FIG. 7) could be recorded and utilized as a continuing control program for equalizer 220, permitting subsequent use of circuit 320 to generate control programs for other equalizer networks like that of FIG. 6.

Starting with the frequency response equation (2), by inverse Fourier transform the following equation can be derived:

$$a_n = \frac{1}{2\pi} \int_{-\pi}^{+\pi} H(\theta) e^{+in\theta} d\theta. \tag{5}$$

Equation (5) shows that, given the desired response $H(\theta)$, the scaling coefficients $a_n$ can be calculated by the methods of Fourier analysis. If $H(\theta)$ is defined by a group of potentiometer settings, with each setting valid over the band pass ranges for an equalizer network like network 120 of FIG. 3, then equation (5) can be rewritten as $$a_n \approx \frac{1}{2\pi} \int_{-\pi}^{+\pi} \Sigma_m H_m e^{+in\theta} d\theta. \tag{6}$$

In equation (6), when $H_m$ is even and represents the real part of a minimum phase response, then $$a_n \approx \frac{1}{2\pi} \int_0^{\pi} \Sigma_m H_m \cos n\theta \, d\theta. \tag{7}$$

Furthermore, if each $H_m$ is valid from $\theta_m$ to $\theta_{m+1}$, then the following relationships are applicable:

$$a_o \approx \frac{1}{\pi} \Sigma_m H_m(\theta_{m+1} - \theta_m) \text{ and} \tag{8}$$

$$a_n \approx \frac{2}{\pi} \Sigma_m H_m \left[ \frac{\sin n\theta_{m+1} - \sin n\theta_m}{n} \right] \text{ for } n > 0.$$

Figure 8:
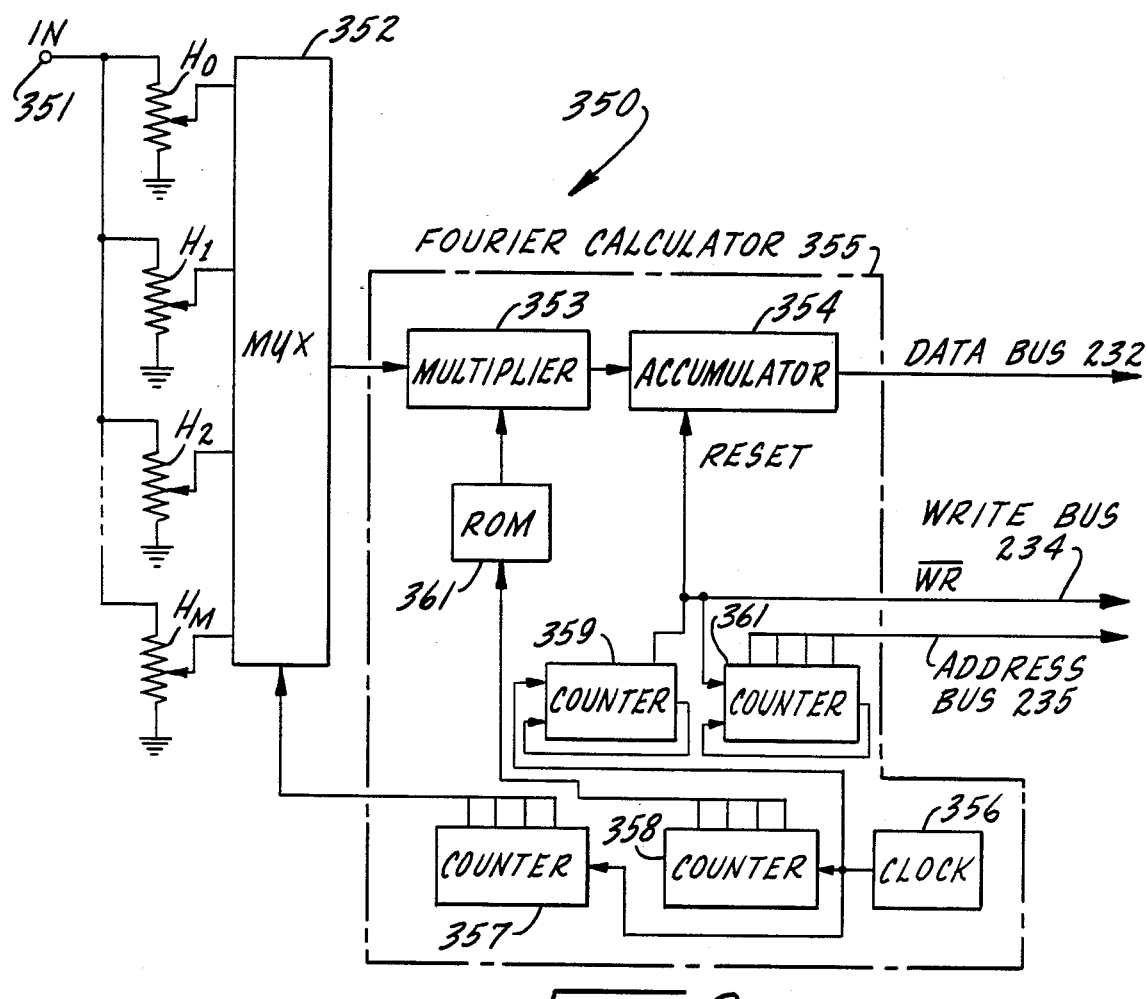
FIG. 8 is a block diagram of an alternative circuit to generate control signals to be utilized in the embodiment of FIG. 6.

Equations (8) are implemented by the circuit 350 illustrated in FIG. 8.

The circuit 350, FIG. 8, has an input circuit 351 connected to each of a series of potentiometers $H_1$ through $H_M$ with the output of each of these potentiometers connected to a multiplexer 352. The output of multiplexer 352 is applied to a multiplier circuit 353 which in turn has its output connected to an accumulator 354 that supplies the data bus 232 (see FIG. 6).

Circuits 353 and 354 are incorporated in a Fourier calculator circuit 355. Calculator circuit 355 includes a clock signal generator 356 having its output connected to three counter circuits 357, 358, and 359. Counter circuit 357 supplies timing signals to the multiplexer 352. Counter 358 supplies timing signals to a read only memory circuit 361 in which a sequence of digital signals representative of the functions set forth in equations (8), exclusive of the $H_m$ terms, have been recorded. The output of ROM 361 constitutes a second input for multiplier circuit 353. Counter 359 generates the $\overline{WR}$ signals for the WRITE bus 234; the $\overline{WR}$ signal is also employed as a reset signal for accumulator 354. The $\overline{WR}$ signal also actuates another counter 361 that generates the address signals for bus 235.

To calculate a given scaling coefficient $a_n$ for a given MDAC in the equalizer 220 of FIG. 6, using the circuit 350 shown in FIG. 8, a reference voltage is applied to input terminal 351 of circuit 350. It may be assumed that the potentiometers $H_1$ through $H_M$ have been set in accordance with the desired frequency response characteristic. To determine the scaling coefficient $a_2$ for MDAC 242 in equalizer 220 (FIG. 6), for example, multiplexer 352 is gated by the input signal from counter 357 to connect potentiometer $H_1$ multiplier 353. At the same time, ROM 361 is actuated, by the input signal from counter 358, to supply an output signal corresponding to the function $$\frac{2}{\pi} \left[ \frac{\sin 2\theta_2 - \sin 2\theta_1}{2} \right]$$

to multiplier 353, so that the output of multiplier 353 corresponds to the product of the function from ROM 361 and the output from potentiometer $H_1$. The digital output signal developed by multiplier 353 is stored in accumulator 354.

Next, potentiometer $H_2$ is gated to multiplier 353 through multiplexer 352 and multiplied by the next output function from ROM 361, which is $$\frac{2}{\pi} \left[ \frac{\sin 2\theta_3 - \sin 2\theta_2}{2} \right]$$

and the resulting digital signal developed by multiplier 353 is supplied to accumulator 345. This procedure is continued until potentiometer $H_M$ is gated to multiplier 353 through circuit 352 and multiplied by $$\frac{2}{\pi} \left[ \frac{\sin 2\theta_{M+1} - \sin 2\theta_M}{2} \right]$$

supplying an additional output to accumulator 354. In accumulator 354, the input signals from multiplier 353 are added together, the resulting digital signal constituting the scaling coefficient control signal for MDAC 242 in FIG. 6, assuming that n=2. This signal is output on data bus 232 in coincidence with an address signal for the MDAC on bus 235 and a WRITE signal on bus 234 to record the scaling coefficient $a_2$ in MDAC 242.

The $\overline{WR}$ signal also resets accumulator 354 (FIG. 8) and the process is repeated with the appropriate outputs from ROM 361 for n−3 to generate the scaling coefficient control signal for the next MDAC 243 (FIG. 6). In this manner, all of the required control signals for equalizer network 220 (FIG. 6) can be generated, in a repetitive sequence, by circuit 350 (FIG. 8). If Hamming weighting or other smooth truncation weighting of the scaling coefficients is desired, it may be included in the programming of ROM 361; alternatively, truncation weighting may be effected by analog weighting resistors incorporated in series with each of the MDAC circuits in equalizer network 220, FIG. 6.

Figure 9:
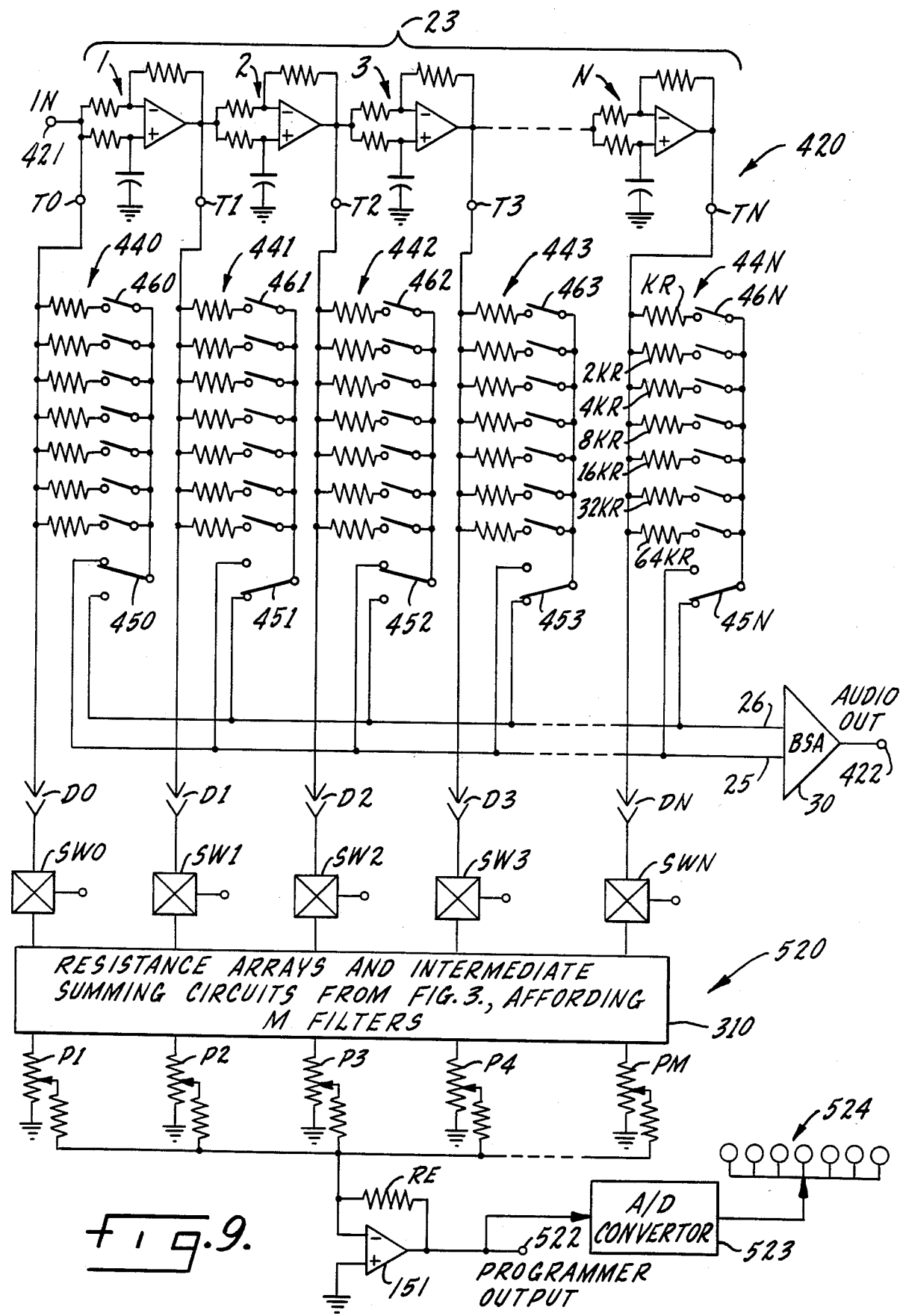
FIG. 9 is a simplified schematic diagram of a programmable equalizer network constructed in accordance with another embodiment of the invention together with a circuit used to generate a program for that equalizer.

FIG. 9 illustrates another embodiment of the invention comprising a programmable minimum phase shift transversal equalizer network 420, shown in conjunction with a programming circuit 520. Equalizer network 420 is similar in construction to network 20 of FIG. 1, being based upon an N-stage all pass delay chain 23. Network 420 has an input terminal 421 and an output terminal 422. Output terminal 422 is connected to the output of a bus summming amplifier 30 having inputs from a non-inverting bus 25 and an inverting bus 26, corresponding to the circuit arrangement of FIG. 1.

Equalizer network 420 of FIG. 9, however, provides a programmable set of resistors to connect the taps T0 through TN of chain 23 to buses 25 and 26, instead of the simple resistors R0 through RN employed in the circuit of FIG. 1. Thus, as shown in FIG. 9, tap T0 of the all pass chain 23 is connected to a parallel connection binary set of resistors 440 having a switch 460 connected in series with each resistor so that any desired combination of the resistors can be connected to either bus 25 or bus 26 through a polarity switch 450. Similarly, taps T1, T2, and T3 are each connected to a parallel connected binary set of resistors 441, 442, and 443, respectively, which can be connected to either bus 25 or bus 26 by one of the polarity setting switches 451, 452, and 453, respectively. This arrangement is carried out throughout network 420, culminating in the set of binary resistors 44N that can be connected, in any desired combination determined by the settings of switches 46N, between tap TN and either of buses 25 and 26, the bus connection being determined by a polarity switch 45N. The relative mag-nitudes of the resistors in set 44N range from KR to 64KR.

Programming circuit 520 corresponds to the switching, filter, and summation circuits of network 120, FIG. 3. Thus, in programming circuit 520, FIG. 9, the resistance arrays and intermediate summing circuits of unit 310 (see FIG. 3) are connected to the taps T0 through TN of delay chain 23 through a series of disconnects D0 through DN and the switches SW0 through SWN. Switches SW0 . . . SN are shown in FIG. 9 as electronic switches, as in the arrangement of FIG. 7, but manual switches as shown in FIG. 3 could be utilized. The output potentiometers P1 through PM are again connected to a summing amplifier 151 that is in turn connected to an output terminal 522. Output terminal 522 is also connected to an analog/digital converter 523. The output of converter 523 is connected to a digital display 524.

In considering the operation of the circuits illustrated in FIG. 9, it should first be assumed that all of the binary resistor sets 440 through 44N are disconnected from busses 25 and 26, which may be accomplished by opening all of switches 450 through 45N. Furthermore, programmer 520 is connected to delay stage chain 23 as shown. Under these circumstances a "white" noise signal is supplied to input terminal 421 and potentiometers P1 through PM are adjusted, in the same manner as previously described for FIGS. 3 and 7, to obtain a desired frequency response characteristic at output terminal 522.

Once the equalizer network afforded by circuit 520 has been set up as described, a DC reference signal is applied to input terminal 421. Switch SW0 is closed and the remaining switches SW1 through SWN are opened. This produces a DC output at terminal 452 that is proportional to the required sealing coefficient for tap T0 and has a polarity corresponding to the sign required for that scaling coefficient. This DC output is supplied to converter 523, which develops an output signal identifying the magnitude and polarity for the scaling circuit required for tap T0 to match the frequency response characteristic to which network 520 has been adjusted. The binary resistor set 440 can then be adjusted to approximate this resistance value, by closing an appropriate combination of switches 460, and switch 450 can be set in accordance with the required output polarity for tap T0.

The foregoing procedure is then repeated for each of the switches SW1 through SWN and each of the binary resistor sets 441 through 44N is set accordingly. In this way, equalizer network 420 is programmed to match the frequency response characteristic to which potentiometers P1 through PM were previously set in the preliminary adjustment of network 520. At this point, using disconnects D0 through DN, equalizer network 420 may be detected from circuit 520 and incorporated in a system that requires the frequency response to which it has been set. Circuit 520 can be used repetitively in setting other equalizer networks to any desired frequency response characteristics. Furthermore, if one of these programmed equalizer networks, such as network 420, subsequently requires re-calibration to suit a change in system conditions, this can be readily accomplished by again connecting the equalizer to a programming network like circuit 520 to effect the necessary changes.

It will be recognized that programming circuit 520 can be implemented separately from equalizer network 420 if provided with its own all pass chain 23, provided the all pass chain in the programmer closely matches that of the equalizer.

The number of all pass stages required in chain 23, for any of the previously described embodiments of the invention, may be determined approximately in accordance with the relationship $$N \approx \frac{\pi f_0}{f_L} \approx \frac{\pi f_H}{f_0} \qquad (9)$$

in which
$f_0 \approx \frac{1}{2}\pi RC$,
$f_L$ is the lower limit of the frequency range,
$f_H$ is the upper limit of the frequency range,
$f_H f_L = f_0^2$, and
RC is the time constant of each delay stage.
Thus, if
$f_0 = 1$ KHz (R = 10 Kilohms, C = 0.015 microfarads),
$f_L = 100$ Hz, and
$f_H = 10$ Khz, then
N = 32 stages;
for $f_L = 200$ Hz and $f_H = 5$ KHz, N = 16 stages.
For a multi-filter network, such as equalizer network 120 of FIG. 3, it is preferred that $M \approx N/2$.

In summary, the transversal filters of the present invention result from an initial analysis based on a series of rectangular prototype (real and even) filters, as discussed above in connection with FIGS. 2 and 5, enabling calculation of a basic set of scaling resistors and polarities for a multi-filter equalizer like FIG. 3. These scaling values are further weighted by a smooth truncating function, such as the Hamming function, to avoid filter overshoot known as the "Gibbs phenomenon". A complete set of adjacent filters can thus be devised to cover a broad frequency range, such as the entire audio range. With the filters all derived from a common chain of all pass stages, and using an algorithm for calculating scaling factors that assures a complete orthonormal set of filters, special useful equalizer properties emerge.

The complete filter set, as in an equalizer network of the kind illustrated in FIG. 3, produces minimum phase shift response. The combination of filters produce a ripple free frequency response characteristic; that is, no individual filter response stands out as a bump or dip superimposed on the overall equalizer response. The transient response of the equalizer shows complete cancelling of ringing of individual filters such that the equalizer network is free of excessive ringing over all. Furthermore, the filter is stable because only first order non-resonant circuits are employed.

For systems having fixed frequency response characteristic requirements, it is not necessary to retain multiple filters in the final equalizer network. Instead, the required frequency response can be set up in a multi-filter equalizer network used as a design tool, and that network can then be utilized to determine a single set of scaling circuit resistances and connection polarities that will produce the same frequency response in a much simpler equalizer network. Such simplified equalizer networks are substantially less complex and less expensive than previously known devices, yet afford exact control of the frequency response. The simplified equalizer networks can themselves be made responsive to externally generated control signals to vary the frequency response in a controlled manner, as described in connection with the equalizer 220 of FIG. 6 and the control signal generator circuits 320 and 350 of FIGS. 7 and 8. Furthermore, a limited modification of the simplified equalizer network yields a programmable equalizer 420 that can be effectively and conveniently modified to fit changes in system conditions as described in connection with FIG. 9, again using a multi-filter equalizer 520 as a design tool.

For persons skilled in the art of digital filters and synthesis of filters by orthonormal functions, it will be apparent that the all pass amplifier chain 23 used in the various embodiments of the invention can be replaced with a chain of pure time delay elements or with circuits described by the exponential, LaGuerre polynomial, and LeGendre polynomial functions, as well as the Fourier series employed herein. The Fourier series technique is preferred for its simple realization, using first order all pass amplifier stages as shown. Time delay elements provided by charge coupled devices or digital delay systems currently lack the highly advantageous attritubes of simplicity, performance, and cost achieved with the all pass stages shown in the drawings. The circuit elements required for the exponential and LeGendre functions are not uniform from stage to stage and impose considerable additional circuit complexities. The LaGuerre functions, on the other hand, can be shown to be a simple generalization of the Fourier method described herein and afford no particular advantages.

I claim:

1. A minimum-phase equalizer network adapted to develop an equalized output signal having a predetermined frequency response characteristic, with minimum ripple, over a preselected frequency range, comprising:

a series chain of N all pass delay stages, the chain having an initial tap connected to the input to the first stage in the chain and N additional taps each connected to the output of a succeeding stage in the chain;

M minimum-phase transversal filters, all connected to and each including the entire series chain of all pass delay stages as a part thereof, each filter developing an intermediate signal within a pass band representative of one of a contiguous series of M nominal frequency bands extending across the frequency range;

final summing circuit means for additively combining the intermediate signals in predetermined amplitude relation to each other to develop the equalized output signal; and adjusting means for adjusting the amplitude of each intermediate signal, independently of the others, to adjust the overall frequency response characteristic of the equalizer network.

2. An equalizer network according to claim 1 in which each filter circuit comprises:

an initial scaling circuit connected to the initial top of the chain and having a scaling coefficient $a_0$ determined approximately by $$a_0 = \frac{1}{\pi}[\theta_{m+1} - \theta_m].$$

N additional scaling circuits, each connected to one of the additional taps, each additional scaling circuit having a scaling coefficient $a_n$ determined approximately by $$a_n = \frac{2}{\pi}\left[\frac{\sin n\theta_{m+1} - \sin n\theta_m}{n}\right] W(n) \text{ for } n > 0;$$

in which:

n is the number of any given all pass stage in the chain, $\theta_{m+1}$ and $\theta_m$ are the phase shifts for one of the all pass stages at the upper and lower frequencies, respectively, of the nominal frequency band for each of the M filters, and W(n) is a truncating function to smooth the overall frequency responses of the filters; and intermediate summing circuit means for additively combining the outputs of all of the scaling circuits, in the polarities determined by their respective scaling coefficients, to develop an intermediate signal as an output from the filter.

3. An equalizer network according to claim 2 in which $$W(n) = 0.54 + 0.46 \cos\frac{\pi n}{N}.$$

4. An equalizer network according to claim 3 in which $M \approx N/2$.

5. An equalizer network according to claim 2 in which each intermediate summing circuit means comprises:

a non-inverting bus to which all scaling circuits having positive scaling coefficients are connected;

an inverting bus to which all scaling circuits having negative scaling coefficients are connected; and an adding amplifier for adding signals from the the two buses together, with the signals from one bus inverted relative to the signals from the other bus.

6. An equalizer network according to claim 5 in which $$W(n) = 0.54 + 0.46 \cos \frac{\pi n}{N},$$

and in which $M \approx N/2$.

7. An equalizer network according to claim 6 in which N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the upper limit of the frequency range,
$f_H f_L = f_0^2$, and
RC is the time constant of each delay stage.

8. An equalizer network according to claim 1 in which N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the lower limit of the frequency range,
$f_H f_L = f_0^2$, and
RC is the time constant of each delay stage.

9. An equalizer network according to claim 8 in which each filter circuit comprises:

an initial scaling circuit connected to the initial tap of the chain and having a scaling coefficient $a_0$ determined approximately by $$a_0 = \frac{1}{\pi} [\theta_{m+1} - \theta_m].$$

N additional scaling circuits, each connected to one of the additional taps, each additional scaling circuit having a scaling coefficient $a_n$ determined approximately by $$a_n = \frac{2}{\pi} \left[ \frac{\sin n \theta_{m+1} - \sin n \theta_m}{n} \right] W(n) \text{ for } n > 0,$$

in which:

n is the number of any given all pass stage in the chain, $\theta_{m+1}$ and $\theta_m$ are the phase shifts for one of the all pass stages at the upper and lower frequencies, respectively, of the nominal frequency band for each of the M filters, and W(n) is a truncating function to smooth the overall frequency responses of the filters; and intermediate summing circuit means for additively combining the outputs of all of the scaling circuits, in the polarities determined by their respective scaling coefficients, to develop an intermediate signal as an output from the filter.

10. An equalizer network according to claim 9 in which $$W(n) = 0.54 + 0.46 \cos \frac{\pi n}{N}.$$

11. An equalizer network according to claim 10 in which $M \approx N/2$.

12. An equalizer network according to claim 1 and further comprising:

switching means including a series of N+1 switches, each interposed between one tap of the chain and all of the filters, to allow measurement of the total contribution of each tap to the overall frequency response of the network.

13. An equalizer network according to claim 12 in which each filter comprises:

an initial scaling circuit connected to the initial tap of the chain and having a scaling coefficient $a_0$ determined approximately by $$a_0 = \frac{1}{\pi} [\theta_{m+1} - \theta_m],$$

N additional scaling circuits, each connected to one of the additional taps, each additional scaling circuit having a scaling coefficient $a_n$ determined approximately by $$a_n = \frac{2}{\pi} \left[ \frac{\sin n \theta_{m+1} - \sin n \theta_m}{n} \right] W(n) \text{ for } n > 0,$$

in which:

n is the number of any given all pass stage in the chain, $\theta_{m+1}$ and $\theta_m$ are the phase shifts for one of the all pass stages at the upper and lower frequencies, respectively, of the nominal frequency band for each of the M filters, and W(n) is a truncating function to smooth the overall frequency response of the filter; and intermediate summing circuit means for additively combining the outputs of all of the scaling circuits, in the polarities determined by their respective scaling coefficients, to develop an intermediate signal as an output from the filter.

14. An equalizer network according to claim 13 in which $$W(n) = 0.54 + 0.46 \cos \frac{\pi n}{N},$$

in which $M \approx N/2$.

15. An equalizer network according to claim 14 in which N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the upper limit of the frequency range,
$f_H f_L = f_0^2$, and
RC is the time constant of each delay stage.

16. An equalizer network according to claim 12 in which each switch is a signal-actuated electronic switching device.

17. An equalizer network according to claim 16, adapted to generation of a series of equalization scaling coefficient control signals, and further comprising:
   clock signal generator means for generating a clock signal;
   counter means, actuated by the clock signal, for generating a predetermined sequence of N+1 digital address signals and a corresponding sequence of write command signals;
   analog/digital convertor means, having inputs comprising the clock signal, the write command signals, and a DC output signal from the summing circuit means, for generating a corresponding sequence of digital scaling control signals; and
   decoder means, actuated by the address signals and having individual outputs to the switching devices, for closing the switching devices in said predetermined sequence.

18. An equalizer network according to claim 12, adapted to generation of a program of scaling resistance values for use in another equalizer, and further comprising:
   analog/digital convertor means, connected to the output of the final summing circuit means, for generating a sequence of N+1 digital signals representative of scaling resistance values corresponding to the DC outputs of the final summing circuit produced by applying a reference DC input to the equalizer and closing the switches one at a time.

19. An equalizer network according to claim 18 in which each filter circuit comprises:
   an initial scaling circuit connected to the initial tap of the chain and having a scaling coefficient $a_0$ determined approximately by $$a_0 = \frac{1}{\pi}[\theta_{m+1} - \theta_m],$$

N additional scaling circuits, each connected to one of the additional taps, each additional scaling circuit having a scaling coefficient $a_n$ determined approximately by $$a_n = \frac{2}{\pi}\left[\frac{\sin n\theta_{m+1} - \sin n\theta_m}{n}\right] W(n) \text{ for } n > 0,$$

in which:
   n is the number of any given all pass stage in the chain,
   $\theta_{m+1}$ and $\theta_m$ are the phase shifts for one of the all pass stages at the upper and lower frequencies, respectively, of the nominal frequency band for each of the M filters, and
   W(n) is a truncating function to smooth the overall frequency responses of the filters; and
   intermediate summing circuit means for additively combining the outputs of all of the scaling circuits, in the polarities determined by their respective scaling coefficients, to develop an intermediate signal as an output from the filter.

20. An equalizer network according to claim 19 in which $$W(n) = 0.54 + 0.46 \cos\frac{\pi n}{N}$$

and in which $M \approx N/2$.

21. An equalizer network according to claim 20 in which N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the upper limit of the frequency range,
$f_H f_L = f_0^2$, and
RC is the time constant of each delay stage.

22. An equalizer network according to claim 18, and further comprising a digital readout indicator connected to the output of the analog/digital convertor.

23. An equalizer network according to claim 22 in which each switch is a signal-actuated electronic switching device.

24. A minimum-phase equalizer network adapted to develop an equalized output output signal having a predetermined frequency response characteristic with minimum ripple, over a preselected frequency range, comprising:
   a series chain of N all pass delay stages, the chain having an initial tap connected to the input to the first stage in the chain and N additional taps each connected to the output of a succeeding stage in the chain;
   N+1 scaling circuits, each connected to one of the taps,
   each scaling circuit having a scaling coefficient with a magnitude and polarity representative of the algebraic sum of the scaling coefficients, for the tap to which the scaling circuit is connected, that would be incorporated in a group of M smoothly truncated minimum-phase transversal filters covering contiguous frequency bands encompassing the preselected frequency range and driven by all stages in a corresponding chain of N all pass delay stages, which M filters would conjointly afford the predetermined frequency response characteristic over the preselected frequency range;
   and summing circuit means for additively combining the outputs of all of the scaling circuits, in the polarity relationships determined by their respective scaling coefficients, to develop the equalized output signal.

25. An equalizer network according to claim 24 in which N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the upper limit of the frequency range,
$f_H f_L = f_0^2$ and
RC is the time constant for each delay stage.

26. An equalizer network according to claim 25 in which $M \approx N/2$.

27. An equalizer network according to claim 26 in which the summing circuit means comprises:
a non-inverting bus to which all scaling circuits having positive scaling coefficients are connected;
an inverting bus to which all scaling circuits having negative scaling coefficients are connected; and
an adding amplifier for adding signals from the two buses together, with the signals from one bus inverted relative to the signals from the other bus.

28. An equalizer network according to claim 24 in which the summing circuit means comprises:
a non-inverting bus to which all scaling circuits having positive scaling coefficients are connected;
an inverting bus to which all scaling circuits having negative scaling coefficients are connected; and
an adding amplifier for adding signals from the two buses together, with the signals from one bus inverted relative to the signals from the other bus.

29. An equalizer network according to claim 24 in which each of the M filters comprises:
an initial filter scaling circuit connected to the initial tap of the chain and having a scaling coefficient $a_O$ determined approximately by $$a_0 = \frac{1}{\pi} [\theta_{m+1} - \theta_m],$$

N additional filter scaling circuits, each connected to one of the additional taps, each additional scaling circuit having a scaling coefficient $a_n$ determined approximately by $$a_n = \frac{2}{\pi} \left[ \frac{\sin n\theta_{m+1} - \sin n\theta_m}{n} \right] W(n) \text{ for } n > 0,$$

in which:
n is the number of any given all pass stage in the chain,
$\theta_{m+1}$ and $\theta_m$ are the phase shifts for one of the all the pass stages at the upper and lower frequencies, respectively, of the nominal frequency band for each of the M filters, and
W(n) is a truncating function to smooth the overall frequency responses of the filters;
summing circuit means for additively combining the outputs of all of the filter scaling circuits, in the polarities determined by their respective scaling coefficients, to develop a filter output signal; and
means to adjust the amplitude of the filter output signal.

30. An equalizer network according to claim 29 in which $$W(n) = 0.54 + 0.46 \cos \frac{\pi n}{N}.$$

31. An equalizer network according to claim 30 in which $M \approx N/2$.

32. An equalizer network according to claim 29 in which N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the upper limit of the frequency range,
$f_H f_L = f_0^2$ and
RC is the time constant for each delay stage.

33. An equalizer network according to claim 29 in which the summing circuit means for each filter comprises:
a non-inverting bus to which all scaling circuits having positive scaling coefficients are connected;
an inverting bus to which all scaling circuits having negative scaling coefficients are connected; and
an adding amplifier for adding signals from the two buses together, with the signals from one bus inverted relative to the signals from the other bus.

34. An equalizer network according to claim 24 in which each scaling circuit comprises:
a parallel connected plurality of scaling resistances; and
scaling resistance switching means, comprising a corresponding plurality of scaling resistance switches each connected to series with the scaling resistances.

35. An equalizer network according to claim 34 in which the summing circuit means comprises:
a non-inverting bus to which all scaling circuits having positive scaling coefficients are connected;
an inverting bus to which all scaling circuits having negative scaling coefficients are connected; and
an adding amplifier for adding signals from the two buses together, with the signals from one bus inverted relative to the signals from the other bus;
and in which each scaling circuit further comprises polarity switching means to connect the scaling circuit to either the inverting bus or the non-inverting bus.

36. An equalizer network according to claim 34 in which the scaling resistance in each scaling circuit comprise a binary series, in magnitude, each successive resistance twice the magnitude of the prior resistance in the series.

37. An equalizer network according to claim 36 in which the summing circuit means comprises:
a non-inverting bus to which all scaling circuits having positive scaling coefficients are connected;

an inverting bus to which all scaling circuits having negative scaling coefficients are connected; and an adding amplifier for adding signals from the two buses together, with the signals from one bus inverted relative to the signals from the other bus;

and in which each scaling circuit further comprises polarity switching means to connect the scaling circuit to either the inverting bus or the non-inverting bus.

38. An equalizer network according to claim 24 in which each scaling circuit comprises multiplying circuit means for multiplying an input signal, from the chain output tap associated therewith, by a scaling coefficient determined by a scaling control signal input to the multiplying circuit means, and in which the equalizer network further comprises scaling control signal generator means, connected to all of the multiplying circuit means, for supplying a series of scaling control signals to the multiplying circuit means, each scaling control signal representative of the scaling coefficient for the scaling circuit in which the multiplying circuit means is incorporated.

39. An equalizer network according to claim 38 in which each multiplying circuit means comprises a multiplying digital to analog converter, and in which each scaling control signal from the scaling signal generator means is a digital signal indicative of both amplitude and polarity of the scaling coefficient represented thereby.

40. An equalizer network according to claim 39 in which N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the upper limit of the frequency range,
$f_H f_1 = f_0^2$ and
RC is the time constant for each delay stage.

41. An equalizer network according to claim 40 in which the scaling coefficients for the equalizer network are based on a group of M filters, and $M \approx N/2$.

42. An equalizer network according to claim 38 in which the scaling control signal generator means comprises:

a series chain of N all pass delay stages, the chain having an initial tap connected to the input to the first stage in the chain and N additional taps each connected to the output of a succeeding stage in the chain;

M minimum-phase transversal filters, all of the filters being connected to and each filter including the entire series chain of all pass delay stages of the scaling control signal generator, each filter developing an intermediate signal within a pass band representative of one of a contiguous series of M nominal frequency bands extending across the frequency range;

N+1 signal-actuated electronic switching devices, each interposed between one tap of the scaling control signal generator chain of all pass delay stages and all of the filters of that signal generator;

summing circuit means for additively combining the intermediate signals from the scaling control signal generator filters; and analog/digital convertor means, connected to the output of the summing circuit means of the scaling control signal generator, for generating a sequence of N+1 digital scaling control signals representative of scaling coefficient values corresponding to the DC outputs of the summing circuit produced by applying a reference DC input to the equalizer and closing the electronic switching individually in predetermined sequence.

43. An equalizer network according to claim 42 in which the analog/digital convertor means of the scaling control signal generator comprises:

clock signal generator means for generating a clock signal;

counter means, actuated by the clock signal, for generating a predetermined sequence of N+1 digital address signals and a corresponding sequence of write command signals;

an analog/digital convertor circuit, having inputs comprising the clock signal, the write command signals, and the DC output signals from the summing circuit means, for generating a corresponding sequence of digital scaling control signals; and decoder means, actuated by the address signals and having individual outputs to the switching devices, for closing the switching devices in said predetermined sequence.

44. An equalizer network according to claim 43 in which each multiplying circuit means comprises a multiplying digital to analog converter, and in which each scaling control signal from the scaling signal generator means is a digital signal indicative of both amplitude and polarity of the scaling coefficient represented thereby.

45. An equalizer network according to claim 44 in which N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the upper limit of the frequency range,
$f_H f_1 = f_0^2$ and
RC is the time constant for each delay stage.

46. An equalizer network according to claim 45 in which the sealing coefficients for the equalizer network are based on a group of M filters, and $M \approx N/2$.

47. An equalizer network according to claim 38 in which the scaling signal control generator means comprises:

reference signal generator means for generating a series of M DC reference signals $H_1$ through $H_M$ conjointly representative of the frequency response characteristic of the equalizer network in accordance with the relationship $$H(\theta) = \sum_{n=0}^{N} a_n e^{-in\theta};$$

multiplier means for multiplying the reference signals by a sequence of function data signals representative of the function $$\frac{2}{\pi}\left[\frac{\sin n\theta_{m+1} - \sin n\theta_m}{n}\right],$$

in which n is the number of one stage in the all pass chain, $\theta$ is the phase shift of any signal of frequency f within the operational range of any delay stage in the chain, and $\theta_{m+1}$ and $\theta_m$ are the phase shifts for one of the all pass filters at the upper and lower frequencies, respectively, of the nominal pass band for each of the M filters, to develop a series of sequences of intermediate scaling coefficient signals;

and accumulator means for adding each sequence of intermediate scaling coefficient signals to generate a series of scaling control signals each representative of the scaling coefficient for one scaling circuit in the equalizer network.

48. An equalizer network according to claim 47 in which:
the multiplying circuit means in each scaling circuit comprises a multiplying digital to analog convertor having a digital multiplier memory; and
the function data signals and scaling control signals are digital signals indicative of both amplitude and polarity of the scaling coefficients represented thereby.

49. An equalizer network according to claim 48 in which the scaling signal control generator means further comprises:
digital memory means for storing the sequence of function data signals, the digital memory means having an output connected to the multiplier means;
multiplexer means, interposed between the reference signal generator means and the multiplier means, for supplying the reference signals to the multiplier means in predetermined time sequence;
and clock means connected to and actuating the multiplexer means, the digital memory means, and the accumulator means in timed coordination with each other.

50. An equalizer network according to claim 49 and further comprising:
reset counter means, in the clock means, for generating a reset signal, supplied to the accumulator means to terminate accumulation of each scaling control signal;
write bus means for applying the reset signal to the multiplying convertors in the scaling circuits as a write command signal for recording the scaling control signals in the multiplier memories thereof;
address counter means, in the clock means, for generating a repeating sequence of N unique address signals, one for each scaling circuit, with the change to the next address signal occurring in one-for-one synchronism with the reset signal;
and address bus and decoder means for applying the address signals to the multiplying convertors in the scaling circuits to limit recording of each scaling control signal to the multiplier memory in the multiplying convertor of just one scaling circuit.

51. An equalizer network according to claim 50 in which N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the upper limit of the freqency range,
$f_H f_1 = f_0^2$ and
RC is the time constant for each delay stage.

52. An equalizer network according to claim 51 in which the scaling coefficients for the equalizer network are based on a group of M filters, and $M \approx N/2$.

53. A scaling control signal generator for generating a series of scaling control signals for a simplified equalizer network comprising a series chain of N all pass delay stages having an initial output tap connected to the input to the first stage in the chain and N additional output taps each connected to the output of a succeeding stage in the chain, N+1 scaling circuits each connected to one of the output taps, each scaling circuit including a multiplying digital to analog convertor for multiplying an input signal from the associated chain output tap by a digital scaling control signal indicative of a scaling coefficient, and summing circuit means for additively combining the outputs of all of the scaling circuits in the polarity relationships determined by their respective scaling coefficients, the scaling control signal generator comprising:
reference signal generator means for generating a series of M DC reference signals $H_1$ through $H_M$ conjointly representative of the frequency response characteristic of the equalizer network in accordance with the relationship $$H(\theta) = \sum_{n=0}^{N} a_n e^{-in\theta};$$

multiplier means for multiplying the reference signals by a sequence of digital function data signals representative of the Fourier function series $$\frac{2}{\pi}\left[\frac{\sin n\theta_{m+1} - \sin n\theta_m}{n}\right];$$

in which n is the number of one stage in the all pass chain, $\theta$ is the phase shift of any signal of frequency f within the operational range of any delay stage in the chain, and $\theta_{m+1}$ and $\theta_m$ are the phase shifts for one of the all pass delay stages at the upper and lower frequencies, respectively, of the nominal pass band for each of the delay stages to develop a series of sequences of intermediate scaling coefficient signals;

and accumulator means for adding each sequence of intermediate scaling coefficient signals to generate a series of scaling control signals each representative of the scaling coefficient for one scaling circuit in the equalizer network.

54. A scaling control signal generator according to claim 53 and further comprising:

digital memory means for storing the sequence of digital function data signals, the digital memory means having an output connected to the multiplier means;

multiplexer means, interposed between the reference signal generator means and the multiplier means, for supplying the reference signals to the multiplier means in predetermined time sequence;

and clock means connected to and actuating the multiplexer means, the digital memory means, and the accumulator means in timed coordination with each other.

55. A scaling control signal generator according to claim 54 and further comprising:

reset counter means, in the clock means, for generating a reset signal, supplied to the accumulator means to terminate accumulation of each digital scaling control signal;

and address counter means, in the clock means, for generating a repeating sequence of N unique address signals, with the change to the next address signal occurring in one-for-one synchronism with the reset signal.

56. A scaling control signal generator according to claim 54 in which the sequence of digital function data signals stored in the digital memory means is modified to be representative of the function series $$\frac{2}{\pi}\left[\frac{\sin n\theta_{m+1} - \sin n\theta_m}{n}\right] W(n)$$

for $n > 0$, in which $W(n)$ is a truncating function to smooth the overall frequency response of the filter.

57. A scaling control signal generator according to claim 56 in which $$W(n) = 0.54 + 0.46 \cos \frac{\pi n}{N}.$$

58. A method of developing the scaling coefficients to obtain a predetermined frequency response characteristic, over a preselected frequency range, from a simplified equalizer network comprising a series chain of N all pass delay stages having an initial output tap connected to the input to the first stage in the chain and N additional output taps each connected to the output of a succeeding stage in the chain, N+1 scaling circuits each connected to one of the output taps, and summing circuit means for additively combining the outputs of all of the scaling circuits in the polarity relationships determined by their respective scaling coefficients, the method comprising the following steps:

A. providing an adjustable equalizer network comprising a series chain of N all pass delay stages having the same construction as the all pass chain of the simplified network, M minimum phase shift transversal filter circuits, each filter comprising N+1 scaling circuits connected to all stages of the all pass chain and an intermediate summing circuit for additively combining the filter scaling circuit outputs in predetermined polarity relationships to develop an intermediate signal in one of a series of M pass bands extending across the frequency range, and final circuit summing means for additively combining the intermediate signals to develop an equalized output signal;

B. applying a "white" noise signal to the all pass chain of the adjustable equalizer network;

C. adjusting the relative amplitudes of the intermediate signals to obtain the predetermined frequency response characteristic at the output of the adjustable equalizer network;

D. substituting a DC reference signal input for the white noise input to the adjustable equalizer network;

E. disconnecting the filter circuits of the adjustable equalizer network from all but one tap of the all pass chain for that network;

F. measuring the amplitude and polarity of the DC output from the adjustable equalizer to determine the magnitude and sign of a scaling coefficient for the scaling circuit of the simplified equalizer network for that one tap of the all pass chain; and G. repeating steps E and F for each of the remaining N taps of the all pass chain.

59. The method of claim 58, in which, in step A, the M filter circuits are each provided with an initial scaling circuit having a scaling coefficient $a_0$ such that $$a_0 = \frac{1}{\pi} [\theta_{m+1} - \theta_m],$$

and N additional scaling circuits each having a scaling coefficient $a_n$ such that $$a_n = \frac{2}{\pi}\left[\frac{\sin n\theta_{m+1} - \sin n\theta_m}{n}\right] W(n) \text{ for } n > 0,$$

in which:

n is the number of any given all pass stage in the chain, $\theta_{m+1}$ and $\theta_m$ are the phase shifts for one of the all pass stages at the upper and lower frequencies, respectively, of the nominal frequency band for each of the M filters, and $W(n)$ is a truncating function to smooth the overall frequency responses of the filters.

60. A method according to claim 59 in which, in step A, $$W(n) = 0.54 + 0.46 \cos \frac{\pi n}{N}.$$

61. A method according to claim 60 in which, in step A, $M \approx N/2$.

62. A method according to claim 58 in which, in step A, N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
$f_H$ is the upper limit of the frequency range,
$f_H f_L = f_0^2$ and RC is the time constant for each delay stage.

63. The method of claim 62, in which, in step A, the M filter circuits are each provided with an initial scaling circuit having a scaling coefficient $a_0$ such that $$a_0 = \frac{1}{\pi} [\theta_{m+1} - \theta_m],$$

and N additional scaling circuits each having a scaling coefficient $a_n$ such that $$a_n = \frac{2}{\pi} \left[ \frac{\sin n\theta_{m+1} - \sin n\theta_m}{n} \right] W(n) \text{ for } n > 0,$$

in which:
 n is the number of any given all pass stage in the chain,
 $\theta_{m+1}$ and $\theta_m$ are the phase shifts for one of the all pass stages at the upper and lower frequencies, respectively, of the nominal frequency band for each of the M filters, and
 W(n) is a truncating function to smooth the overall frequency response of the filter.

64. A method according to claim 63 in which, in step A, $$W(n) = 0.54 + 0.46 \cos \frac{\pi n}{N}.$$

and $M \approx N/2$.

65. A method according to claim 58 in which each step F is carried out by means of analog/digital convertor means connected to the output of the final circuit summing means for the adjustable equalizer network so that each scaling coefficient for the simplified equalizer network is developed as a digital data signal.

66. The method of claim 65, in which, in step A, the M filter circuits are each provided with an initial scaling circuit having a scaling coefficient $a_0$ such that $$a_0 = \frac{1}{\pi} [\theta_{m+1} - \theta_m],$$

and N additional scaling circuits having a scaling coefficient $a_n$ such that $$a_n = \frac{2}{\pi} \left[ \frac{\sin n\theta_{m+1} - \sin n\theta_m}{n} \right] W(n) \text{ for } n > 0,$$

in which:
 n is the number of any given all pass stage in the chain,
 $\theta_{m+1}$ and $\theta_m$ are the phase shifts of one of the all pass stages at the upper and lower frequencies, respectively, of the nominal frequency band for each of the M filters, and
 W(n) is a truncating function to smooth the overall frequency responses of the filters.

67. A method according to claim 66 in which, in step A, $$W(n) = 0.54 + 0.46 \cos \frac{\pi n}{N}.$$

68. A method according to claim 67 in which, in step A, N is determined in accordance with the relationship $$N \approx \frac{\pi f_0}{f_L} \approx \frac{\pi f_H}{f_0}$$

in which:

$$f_0 = \frac{1}{2\pi RC},$$

$f_L$ is the lower limit of the frequency range,
 $f_H$ is the upper limit of the frequency range,
 $f_H f_L = f_0^2$ and
 RC is the time constant for each delay stage.

69. A method according to claim 68 in which, in step A, $M \approx N/2$.

70. A method of developing the scaling coefficients to obtain a predetermined frequency response characteristic, over a preselected frequency range, from a simplified equalizer network comprising a series chain of N all pass delay stages having an initial output tap connected to the input to the first stage in the chain and N additional output taps each connected to the output of a succeeding stage in the chain, N+1 scaling circuits each connected to one of the output taps, and summing circuit means for additively combining the outputs of all of the scaling circuits in the polarity relationships determined by their respective scaling coefficients, the method comprising the following steps:

A. providing a source of a series of M DC reference signals $H_1$ through $H_M$ conjointly representative of the frequency response characteristic of the equalizer network in accordance with the relationship $$H(\theta) = \sum_{n=0}^{N} a_n e^{-in\theta};$$

B. multiplying each of the signals $H_1$ through $H_M$ by a series of digital data signals representative of the function $$\frac{2}{\pi} \left[ \frac{\sin n\theta_{m+1} - \sin n\theta_m}{n} \right];$$

in which n is the number of one stage in the all pass chain, $\theta$ is the phase shift of any signal of frequency f within the operational range of any delay stage in the chain, and $\theta_{m+1}$ and $\theta_m$ are the phase shifts for one of the all pass delay stages at the upper and lower frequencies, respectively, of the nominal pass band for each of the delay stages, to develop a series of sequences of intermediate scaling coefficient signals;

C. additively combining the series of signals developed in step B to generate a digital data scaling coefficient signal representative of the scaling coefficient for one scaling circuit in the equalizer network;

D. and repeating steps B and C for each of the other stages of the all pass chain.

* * * * *